(12) United States Patent
Estes et al.

(10) Patent No.: US 7,126,151 B2
(45) Date of Patent: *Oct. 24, 2006

(54) INTERCONNECTED HIGH SPEED ELECTRON TUNNELING DEVICES

(75) Inventors: Michael J. Estes, Longmont, CO (US); Garret Moddel, Boulder, CO (US)

(73) Assignee: The Regents of the University of Colorado, a Body Corporate, Boulder, CO (US)

( * ) Notice: Subject to any disclaimer, the term of this patent is extended or adjusted under 35 U.S.C. 154(b) by 198 days.

This patent is subject to a terminal disclaimer.

(21) Appl. No.: 10/337,427

(22) Filed: Jan. 6, 2003

(65) Prior Publication Data

US 2003/0133339 A1 Jul. 17, 2003

Related U.S. Application Data

(63) Continuation-in-part of application No. 10/140,535, filed on May 6, 2002, and a continuation-in-part of application No. 10/103,054, filed on Mar. 20, 2002, now abandoned, and a continuation-in-part of application No. 09/860,988, filed on May 21, 2001, now Pat. No. 6,534,784, and a continuation-in-part of application No. 09/860,972, filed on May 21, 2001, now Pat. No. 6,563,185.

(51) Int. Cl.
*H01L 31/336* (2006.01)

(52) U.S. Cl. ............................ 257/25; 257/25; 257/30; 257/E29.013

(58) Field of Classification Search .................. 257/25, 257/30, 31, 36, 37
See application file for complete search history.

(56) References Cited

U.S. PATENT DOCUMENTS 4,163,920 A     8/1979   Lambe et al.

(Continued)

FOREIGN PATENT DOCUMENTS

GB          2150382 A       6/1985

OTHER PUBLICATIONS

Levi "Optical interconnects in systems," Proceedings of the IEEE, vol. 88, pp. 750-757 (2002).

(Continued)

*Primary Examiner*—Andy Nuynh
*Assistant Examiner*—Thinh T Nguyen
(74) *Attorney, Agent, or Firm*—Pritzkau Patent Group

(57) ABSTRACT

An integrated circuit chip includes a formation of integrated layers configured to define at least one integrated electronic component. The integrated layers further define an integrated electron tunneling device, which includes first and second non-insulating layers spaced apart from one another such that a given voltage can be provided thereacross. The integrated electron tunneling device further includes an arrangement disposed between the first and second non-insulating layers and serving as a transport of electrons between and to the first and second non-insulating layers. The arrangement includes at least a first layer configured such that the transport of electrons includes, at least in part, transport by means of tunneling. The integrated electron tunneling device further includes an antenna structure connected with the first and second non-insulating layers, and the integrated electron tunneling device is electrically connected with the integrated electronic component.

10 Claims, 14 Drawing Sheets

U.S. PATENT DOCUMENTS

| | | | |
|---|---|---|---|
| 4,272,641 | A | 6/1981 | Hanak |
| 4,344,052 | A | 8/1982 | Davidson |
| 4,442,185 | A | 4/1984 | Skotheim |
| 4,445,050 | A | 4/1984 | Marks |
| 4,482,779 | A | 11/1984 | Anderson |
| 4,857,893 | A | 8/1989 | Carroll |
| H667 | H | 9/1989 | Bedair et al. |
| 4,973,858 | A | 11/1990 | Chang |
| 5,018,000 | A | 5/1991 | Yamada et al. |
| 5,019,530 | A | 5/1991 | Kleinsasser et al. |
| 5,056,111 | A | 10/1991 | Duling, III et al. |
| 5,067,788 | A | 11/1991 | Jannson et al. |
| 5,157,361 | A | 10/1992 | Gruchalla et al. |
| 5,202,752 | A | 4/1993 | Honjo |
| 5,208,726 | A | 5/1993 | Apel |
| 5,302,838 | A | 4/1994 | Roenker et al. |
| 5,326,984 | A | 7/1994 | Rosencher et al. |
| 5,335,361 | A | 8/1994 | Ghaem |
| 5,345,231 | A | 9/1994 | Koo et al. |
| 5,362,961 | A | 11/1994 | Hamanaka |
| 5,455,451 | A | 10/1995 | Usagawa et al. |
| 5,543,652 | A | 8/1996 | Ikeda et al. |
| 5,606,177 | A | 2/1997 | Wallace et al. |
| 5,621,222 | A | 4/1997 | Kimura |
| 5,621,913 | A | 4/1997 | Tuttle |
| 5,737,458 | A * | 4/1998 | Wojnarowski et al. ......... 385/15 |
| 5,751,629 | A | 5/1998 | Nova et al. |
| 5,754,948 | A | 5/1998 | Metze |
| 5,764,655 | A | 6/1998 | Kiribara et al. |
| 5,796,119 | A | 8/1998 | Seabaugh |
| 5,825,049 | A | 10/1998 | Simmons et al. |
| 5,825,240 | A | 10/1998 | Geis et al. |
| 5,883,549 | A | 3/1999 | De Los Santos |
| 5,895,934 | A | 4/1999 | Harvey et al. |
| 5,994,891 | A | 11/1999 | Hubbell |
| 6,034,809 | A | 3/2000 | Anemogiannis |
| 6,049,308 | A | 4/2000 | Hietala et al. |
| 6,077,722 | A | 6/2000 | Jansen et al. |
| 6,091,374 | A | 7/2000 | Barnes |
| 6,096,496 | A | 8/2000 | Frankel |
| 6,107,562 | A | 8/2000 | Hashimoto et al. |
| 6,110,393 | A | 8/2000 | Simmons et al. |
| 6,121,541 | A | 9/2000 | Arya |
| 6,181,001 | B1 | 1/2001 | Ikefuji et al. |
| 6,195,485 | B1 | 2/2001 | Coldren et al. |
| 6,211,531 | B1 | 4/2001 | Nakazato et al. |
| 6,263,193 | B1 | 7/2001 | Iseki et al. |
| 6,284,557 | B1 | 9/2001 | Yiu et al. |
| 6,323,821 | B1 | 11/2001 | McLean |
| 6,329,655 | B1 | 12/2001 | Jack et al. |
| 6,329,958 | B1 | 12/2001 | McLean et al. |
| 6,373,447 | B1 | 4/2002 | Rostoker et al. |
| 6,380,614 | B1 | 4/2002 | Higuchi et al. |
| 6,424,223 | B1 | 7/2002 | Wang et al. |
| 6,442,321 | B1 | 8/2002 | Berini |
| 6,459,084 | B1 | 10/2002 | Boreman et al. |
| 6,512,431 | B1 | 1/2003 | Pergande |
| 6,534,784 | B1 | 3/2003 | Eliasson et al. |
| 6,542,720 | B1 | 4/2003 | Tandy |
| 6,563,185 | B1 * | 5/2003 | Moddel et al. ............. 257/425 |
| 6,614,960 | B1 | 9/2003 | Berini |
| 6,664,562 | B1 | 12/2003 | Weiss et al. |
| 2002/0014999 | A1 | 2/2002 | Crowley |
| 2002/0145566 | A1 | 10/2002 | Ballantine et al. |
| 2003/0059147 | A1 | 3/2003 | Berini |
| 2003/0179974 | A1 | 9/2003 | Estes et al. |

OTHER PUBLICATIONS

Markoff, "New material to allow plastic transistors," New York Times, Dec. 3, 2002.

Paulson, "Researchers bring wireless communications to the chip," IEEE Computer, Sep. 2002.

Savage, "Linking with light," IEEE Spectrum, 39(8), pp. 32-36 (2002).

Soller et al., "Energy transfer at optical frequencies to silicon-based waveguiding structures," J. Opt. Soc. Am. A, 18(10), pp. 2577-2584 (2001).

Soole et al., "Mode-selective detection of optical guided waves by integrated metal-oxide-metal structures," Opt. Lett., 12(7), pp. 536-538, Jul. 1987.

John G. Simmons, *Electric Tunnel Effect between Dissimilar Electrodes Separated by a Thin Insulating Film*, Sep. 1993, Journal of Applied Physics, V34, p. 2581.

S. R. Pollack and C. E Morris, *Electron Tunneling through Asymmetric Films of Thermally Grown $Al_2O_3$*, May 1964, Journal of Applied Physics, V35, N5, p. 1503-1513.

L. O. Hocker, D. R. Sokoloff, V. Daneu, A. Szoke, and A. Javan, *Frequency Mixing in the Infrared and Far-Infrared using a Metal-to-Metal Point Contact Diode*, Jun. 15, 1968, American Institute of Physics, V 12, N 12, p. 401-402.

S. M. Faris, T. Kenneth Gustafson, and John C. Wiesner, *Detection of Optical Infrared Radiation with DC-Biased Electron-Tunneling Metal-Barrier-Metal Diodes*, Jul. 1973, IEEE Journal of Quantum Electronics, V QE-9, N 7, p. 737-745.

C. Furneaux, W. Herrmann, F. K. Kneubuhl, and H. Rothuizen, *Nanometer Thin-Film Ni-NiO-Ni Diodes for Detection and Mixing of 30 THz Radiation*, Jul. 1998, Infrared Physics and technology, V 39, 123-183.

B. Michael Kale, *Electron Tunneling Devices in Optics*, Mar. 1985, Optical Engineering, V 24, N 2, p. 267-274.

G. Papp, M. DiVentra, C. Coluzza, A. Baldereschi, and G. Margaritondo, *Current Rectification through a Single-Barrier Resonant Tunneling Quantum Structure*, 1995, Superlattices and Microstructures, V 17, N 3, p. 273-275.

Alexander Korotkov and Konstantin Likharev, *Resonant Fowler-Nordheim Tunneling through Layered Tunnel Barriers and its Possible Applications*, Mar. 1999, International Electron Device Meeting Technical Digest.

T. Suemasu et al, *Metal ($CoSi_2$)/Insulator ($CaF_2$) Resonant Tunneling Diode*, Jan. 1994, Jpn. Journal of Applied Phyics, V 33, p. 57-65.

M. Asada, K. Osada, and W. Saitoh, *Theoretical Analysis and Fabrication of Small Area Metal/Insulator Resonant Tunneling Diode Integrated with Patch Antenna for Terahertz Photon Assisted Tunneling*, 1998, Solid State Electronics, v 42, N7-8, p. 1543-1546.

Aleksanyan et al, *Feasibility of Developing a Tunable Oscillator Utilizing a System of Metal-Barrier-Metal-Barrier-Metal Junctions*, May 1981, Sov. J. Quantum Electron, vol. 11, No. 5, pp. 635-637.

Aleksanyan et al., *Generation of Electromagnetic Oscillations in Metal-Barrier-Metal-Barrier-Metal Stuctures*, Aug. 1982, Sov. J. Quantum Electron., vol. 12, No. 8, pp. 1090-1092.

Belenov et al, *Amplification of Plasma Oscillations in Complex Metal-Barrier-Metal Structures*, Jul. 1982, Sov. J. Quantum Electron., vol. 12, No. 7, pp. 930-931.

Belenov et al, *Investigation of the Radiation Emitted by Metal-Barrier-Metal Structures*, Apr. 1983, Sov. J. Quantum Electron., vol. 13, No. 4, pp. 451-455.

Belenov et al, *Angular Distribution of the Luminescence Emitted by a Metal-Barrier-Metal Diode*, May 1985, Sov. J. Quantum Electron., vol. 15, No. 5, pp. 735-737.

Belenov et al, *Resonant Tunneling in Multilayer Structures in the Presence of Surface Electromagnetic Waves*, Apr. 1986, Sov. Tech. Phys. Lett., vol. 12, No. 4, pp. 200-202.

Belenov et al, *Emission of Surface Electromagnetic Waves in the Case of Resonance Tunneling of Electrons*, Oct. 1987, Sov. J. Quantum Electron., vol. 17, No. 10, pp. 1348-1352.

Bykovskii et al, *Influence of the Boundary of a Metal Film on the Luminescence Intensity from a Metal-Barrier-Metal Structure*, Sov. Phys. Tech. Phys., Aug. 1986, vol. 31, No. 8, pp. 980-981.

Simon M. Sze, *Physics of Semiconductor Devices*, John Wiley & Sons, 2nd edition, 1981, Chapter 14.

J. Kuendig et al., *Thin-film silicon solar cells for space applications: Radiation hardness and applications for an integrated SOLANT*

(*Solar cell—Antenna*)*module*, 28th IEEE Photovoltaic Specialists Conference, Anchorage, Alaska, Sep. 2000.

G. Ghione and C. Naldi, "Analytical formulas for coplanar lines in hybrid and monolithic MIC's," Electron. Lett., vol. 20, pp. 179-181 (1984).

Tae-Whan Yoo and Kai Chang, "Theoretical and experimental development of 10 and 35 GHz rectennas," IEEE Transactions on Microwave Theory and Techniques, vol. 40, No. 6, pp. 1259-1266 (1992).

Ashok Agrawal and Walter E. Powell, "Monopulse printed circuit dipole array," IEEE Transactions on Antennas and Propagation, vol. AP-33, No. 11, pp. 1280-1283 (1985).

Yu-De Lin and Syh-Nan Tsai, "Coplanar waveguide-fed uniplanar bow-tie antenna," IEEE Transactions on Antennas and Propagation, vol. 45, No. 2, pp. 305-306 (1997).

C. Furneaux, W. Herrmann, F.K. Kneubühl, H. Rothuizen, B. Lipphardt, and C.O. Weiss, "Nanometer thin-film Ni-NiO-Ni diodes for mixing 28 THz $CO_2$-laser emissions with difference frequencies up to 176 GHz," Appl. Phys. B, vol. 66, pp. 327-332 (1998).

D.B. Rutledge, D.P. Neikirk and D.P. Kasilingam, "Integrated-Circuit Antennas," *Infrared and Millimeter Waves*, Kenneth J. Button, ed., vol. 10, Academic Press, pp. 24-27, 74-81 (1983).

David B. Rutledge and Michael S. Muha, "Imaging antenna arrays," IEEE Transactions on Antennas and Propagation, vol. AP-30, No. 4, pp. 535-540 (1982).

N. A. Janunts et al, Modulation of Light Radiation during Input into Waveguide by Resonance Excitation of Surface Plasmons, Jul. 16, 2001, Applied Physics Letters, V 79, No. 3, p. 299-301.

Korotkov et al., "TASERS: Possible DC pumped terahertz laser using interwell transitions in semiconductor heterostructures," Appl. Phys. Lett., vol. 65, No. 15, pp. 1865-1867 (1994).

H. Drexler et al, Photon-Assisted Tunneling in a Resonant Tunneling Diode: Stimulated Emission and Absorption in the THz Range, Nov. 6, 1995, Applied Physics Letters V 67, No. 19, pp. 4102-4104.

K. Kempa et al, Towards Stimulated Generation of Coherent Plasmons in Nanostructures, Mar. 1, 1999, Journal of Applied Physics, V 85, No. 7, pp. 3708-3712.

M. Asada et al, Estimation of Interwell Terahertz Gain by Photon-assisted Tunneling Measurement in Triple-Barrier Resonant Tunneling Diodes, Jul. 31, 2000, Applied Physics Letters, V 77, No. 5, pp. 618-620.

A. Tredicucci et al, Surface Plasmon Quantum Cascade Lasers at ~µm, Oct. 9, 2000, Applied Physics Letters, V 77, No. 15, pp. 2286-2288.

R. Volkov et al, Tunneling-Assisted Photon Emission in MIM Junctions, Jun. 1991, Physics Stat Sol (b) 163.311.

D. Siu et al, Stimulated Electron Tunneling in Metal-Barrier-Metal Structures due to Surface Plasmons, Apr. 1, 1976, Applied Physics Letters, V 28, No. 7, pp. 407-410.

D. Drury et al, Theory of Infrared and Optical Frequency Amplification in Metal-Barrier-Metal Diodes, Jun. 1979, IEE Trans on Microwave Th and Tech, V MTT-27, No. 6, pp. 598-603.

D. Drury et al, A Stimulated Inelastic Tunneling Theory of Negative Differential Resistance in Metal-Insulator-Metal Diodes, Nov. 1980, IEEE J of Quan Elec, V QE-16, No. 1, pp. 58-69.

L Xie, Stimulated Emission of Surface Plasmons in Metal-Insulator-Metal (Transition Metal Type Like) Structures, May 1985, Infrared Phys, V 25, No. 5, pp. 661-664.

J. Schildkraut, Lon-Range Surface Plasmon Electrooptic Modulator, Nov. 1, 1988, Aplied Optics, V 27, No. 21, pp. 4587-4590.

* cited by examiner

INTERCONNECTED HIGH SPEED ELECTRON TUNNELING DEVICES

RELATED APPLICATION

This application is a CIP of U.S. Ser. No. 09/860,988 now U.S. Pat. No. 6,534,784, and is a CIP of Ser. No. 09/860,972 filed May 21, 2001 now U.S. Pat. No. 6,563,185 and is CIP of Ser. No. 10/103,054, filed Mar. 20, 2002, abandoned and CIP of Ser. No. 10/140,535 filed May 6, 2002, all of which application are incorporated herein by reference in their entirety.

BACKGROUND OF THE INVENTION

The present invention relates generally to optoelectronic devices and, more particularly, to interconnection of optoelectronic devices including electron tunneling devices.

Increased amounts and speed of data transfer in communication and computing systems pose a challenge to the current state of device technology. Large quantities of information must be transferred quickly across distances ranging from very short distances, from between chips as well as between boards containing chips, to longer distances between racks of devices, very short reach (VSR)/optical Ethernet and beyond. Even with the development of high-speed communications switches and routers, the data must be taken in and out of such high-speed devices at compatibly high rates in order for the entire system to function efficiently.

Radio frequency (RF) inter-chip and intra-chip connections have been developed as a possible way of transferring data within and between chips. However, RF interconnects use large antennae and/or waveguides on or connected to chips, thus requiring valuable on-chip and device "real estate." Also, RF interconnects are limited in data transfer speed due to the use of radio frequencies.

Other researchers have suggested the use of optical signals as an alternative to electrical signals in providing inter- and intra-chip connections.[1] For instance, parallel fiber-optic interconnects which are edge-connected to semiconductor devices have been developed for use within systems with a large number of electronic components (e.g., computers).[2] Although optical interconnect technology promises the possibility of higher rate data transfer than electrical interconnects, optical interconnect technology, as heretofore suggested, is still cost prohibitive in comparison. There is potentially a huge market for high speed interconnect arrangements because all desktop computers and local area networks would benefit from the use of high speed interconnects between components on chips, between chips, etc.

As will be seen hereinafter, the present invention provides a significant improvement over the prior art as discussed above by virtue of its ability to provide the increased performance while, at the same time, having significant advantages in its manufacturability. This assertion is true for electromagnetic devices generally, which take advantage of the present invention, as well as data communication and computing devices in particular.

BRIEF SUMMARY OF THE INVENTION

As will be described in more detail hereinafter, there is disclosed herein an integrated circuit chip including a formation of integrated layers. The integrated layers are configured so as to define at least one integrated electronic component as well as an integrated electron tunneling device. The integrated electron tunneling device includes first and second non-insulating layers spaced apart from one another such that a given voltage can be provided across the first and second non-insulating layers. The integrated electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The integrated electron tunneling device further includes an antenna structure connected with the first and second non-insulating layers, and the integrated electron tunneling device is electrically connected with the integrated electronic component.

In one aspect of the invention, a method for fabricating an integrated circuit chip is disclosed. The method includes forming a plurality of integrated layers, where the forming step includes the steps of defining at least one integrated electronic component and defining an integrated electron tunneling device. The integrated electron tunneling device includes first and second non-insulating layers spaced apart from one another such that a given voltage can be provided across the first and second non-insulating layers. The integrated electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The integrated electron tunneling device further includes an antenna structure connected with the first and second non-insulating layers. The method further includes electrically connecting the integrated electron tunneling device with the integrated electronic component.

In another aspect of the invention, an integrated circuit chip includes a formation of integrated layers, which integrated layers are configured so as to define at least one integrated electronic component. The integrated circuit chip also includes an electron tunneling device including first and second non-insulating layers spaced apart from one another such that a given voltage can be provided across the first and second non-insulating layers. The electron tunneling device further includes an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The electron tunneling device further includes an antenna structure connected with the first and second non-insulating layers, and the electron tunneling device is formed on top of and separately from the formation of integrated layers without interference with an intended function of the integrated electronic component and its spatial location while being electrically connected with the integrated electronic component.

In still another aspect of the invention, an integrated circuit chip includes a formation of integrated layers, which formation of integrated layers is configured to define at least one integrated electronic component and is further configured to define an integrated optoelectronic device having an antenna. The antenna is configured to receive an optical signal. The integrated optoelectronic device is electrically connected with the integrated electronic component.

In yet another aspect of the invention, an integrated circuit chip includes a formation of integrated layers defining at least one integrated electronic component. The integrated circuit chip also includes an optoelectronic device having an antenna, which antenna is configured to receive an optical signal incident thereon. The optoelectronic device is formed on top of and separately from the formation of integrated layers without interference with an intended function of the integrated electronic component and its spatial location while being electrically connected with the integrated electronic component. In an alternative embodiment, the optoelectronic device is configured to provide an optical signal while the antenna is configured instead to transmit the optical signal.

In a further aspect of the invention, an integrated circuit chip includes at least one substrate and circuitry formed on the substrate, which circuitry includes at least first and second integrated electronic components. The integrated circuit chip also includes a first optoelectronic device for providing an optical signal. The first optoelectronic device includes a first antenna, which first antenna is configured to emit the optical signal, and the first optoelectronic device is supported on the substrate while being electrically connected with the first integrated electronic component. The integrated circuit chip further includes a second optoelectronic device. The second optoelectronic device includes a second antenna, which second antenna is configured to receive the optical signal from the first antenna such that first and second optoelectronic devices are in optical communication with one another, while the second optoelectronic device is also supported on the substrate and is electrically connected with the second integrated electronic component.

In a still further aspect of the invention, an integrated circuit assembly includes first and second substrates. First circuitry, including at least a first integrated electronic component, is formed on the first substrate, and second circuitry, including at least a second integrated electronic component, is formed on the second substrate. The integrated circuit assembly also includes a first optoelectronic device for providing an optical signal. The first optoelectronic device includes a first antenna, which is configured to emit the optical signal, and is supported on the first substrate while being electrically connected with the first integrated electronic component. The integrated circuit assembly further includes a second optoelectronic device including a second antenna. The second optoelectronic device is supported on the second substrate and is electrically connected with the second integrated electronic component. The second antenna is configured to receive the optical signal from the first antenna such that the first and second optoelectronic devices are in optical communication with one another.

In another aspect of the invention, an assembly includes an optoelectronic system, in which an optical signal is present and which includes at least one optoelectronic device configured to act on the optical signal. The assembly also includes an electron tunneling device also configured to act on the optical signal. The electron tunneling device includes first and second non-insulating layers, which are spaced apart from one another such that a given voltage can be provided across the first and second non-insulating layers, and an arrangement disposed between the first and second non-insulating layers, which arrangement is configured serve as a transport of electrons between and to the first and second non-insulating layers. The arrangement includes a first amorphous layer configured such that using only the first amorphous layer in the arrangement would result in a given value of nonlinearity in the transport of electrons, with respect to the given voltage. The arrangement also includes a different, second layer disposed directly adjacent to and configured to cooperate with the first amorphous layer such that the transport of electrons includes, at least in part, transport by means of tunneling through the first amorphous layer and the second layer, and such that the nonlinearity, with respect to the given voltage, is increased over and above the given value of nonlinearity by the inclusion of the second layer without the necessity for any additional layer. The assembly further includes an optical configuration cooperating with the electron tunneling device and with the optoelectronic device such that the optical signal is transmitted therebetween.

In a still another aspect of the invention, a device includes a waveguide, which waveguide in turn includes an optical input port. The optical input port is configured for receiving an input light. The waveguide also includes an optical output port and is configured for directing the input light from the optical input port toward the optical output port. The device also includes an optoelectronic assembly, which includes an electron tunneling device. The electron tunneling device includes first and second non-insulating layers, which are spaced apart from one another such that a given voltage can be provided thereacross, and an arrangement disposed between the first and second non-insulating layers and configured to serve as a transport of electrons between and to the first and second non-insulating layers. The arrangement includes at least a first layer configured such that the transport of electrons includes, at least in part, transport by means of tunneling. The optoelectronic assembly also includes a coupling arrangement configured to cooperate with the electron tunneling device and the waveguide for coupling at least a portion of the input light from the waveguide into the electron tunneling device.

In yet another aspect of the invention, an arrangement includes an optical waveguide with an optical input port, which optical input port is configured for receiving an input light, and an optical output port. The optical waveguide is configured for directing the input light from the optical input port toward the optical output port. The arrangement further includes an optoelectronic assembly with a surface plasmon device, which is configured to act on an input signal. The surface plasmon device includes a device input port, which is configured to receive the input signal, a device output port and a structure including a tunneling junction connected with the device input port and the device output port. The tunneling junction is configured in a way (i) which provides electrons in a particular energy state within the structure, (ii) which produces surface plasmons in response to the input signal, (iii) which causes the structure to act as a surface plasmon waveguide for directing at least a portion of the surface plasmons along a predetermined path toward the device output port such that the surface plasmons so directed interact with the electrons in a particular way, and (iv) which produces at the device output port an output signal resulting from the particular interaction between the electrons and the surface plasmons. The optoelectronic assembly further includes a coupling arrangement, which is configured to cooperate with the surface plasmon device and the optical waveguide for coupling at least a portion of the input light from the waveguide into the surface plasmon device as the input signal.

In a further aspect of the invention, an integrated circuit chip includes a substrate and a formation of integrated layers supported on the substrate, which integrated layers are configured so as to define at least one integrated electronic component. The integrated circuit chip also includes an optical waveguide, which is also supported on the substrate and includes an optical input port configured for receiving an input light including a clock signal encoded thereon. The integrated circuit chip further includes at least one optoelectronic assembly electrically connected with the integrated electronic component and including an electron tunneling device. The electron tunneling device includes first and second non-insulating layers spaced apart from one another such that a given voltage can be provided thereacross. The electron tunneling device also includes an arrangement disposed between the first and second non-insulating layers and configured to serve as a transport of electrons between and to the first and second non-insulting layers. The arrangement includes at least a first layer configured such that the transport of electrons includes, at least in part, transport by means of tunneling. The optoelectronic assembly also includes a coupling arrangement configured to cooperate with the electron tunneling device and the optical waveguide for coupling at least a portion of the input light including the clock signal from the waveguide into the electron tunneling device. The electron tunneling device is configured to (i) receive the portion of the input light, (ii) produce an electric signal and (iii) transmit the electric signal toward the integrated electronic component electrically connected with the optoelectronic assembly for use by the integrated electronic component.

BRIEF DESCRIPTION OF THE SEVERAL VIEWS OF THE DRAWING

The present invention may be understood by reference to the following detailed description taken in conjunction with the drawings briefly described below. It is noted that, for purposes of illustrative clarity, certain elements in the drawings may not be drawn to scale.

DETAILED DESCRIPTION OF THE INVENTION

Figure 1A:
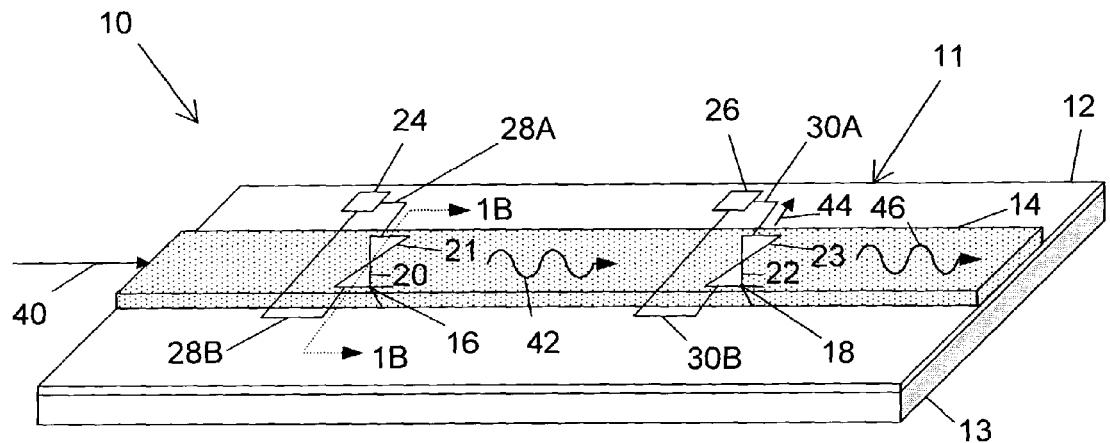
FIG. 1A is a diagrammatic illustration, in perspective view, of an interconnected electron tunneling device of the present invention, shown here to illustrate an embodiment including a planar waveguide on a chip as the interconnection.

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

As described in the Background section, there is a growing need for high speed interconnection between devices over short distances, such as between racks, boards, chips, as well as between components located on a single chip. These interconnection arrangements must be capable of high speed transmission of data and should be low cost. The interconnection arrangements and systems need to be competitive and compatible with current state-of-the-art electrical interconnects in terms of cost, speed, power, distance, requirement for signal processing and allowance of plug-n-play. For low cost, high speed and highest level of integration, the interconnect components may be integrated directly onto silicon integrated circuitry. The interconnect should ideally be compatible with standardized systems and interfaces provided by existing suppliers. In order to accommodate the current state of the technology, the interconnect should be compatible with multi-mode fibers and be time division multiplexing (TDM) or coarse wavelength division multiplexing (CWDM) compatible. Alternatively, depending on the application in which the interconnect is to be used, single-mode fibers might also be used. Polarization-insensitivity is desirable in order to reduce signal loss. VCSEL devices are the mainstay light sources in the current art; therefore the interconnection arrangement should be compatible with VCSEL devices. Currently-available VCSEL devices operate at 850 nm and, potentially, at 1300 and 1550 nm wavelengths. Furthermore, current VCSELs operate at 2.5 Gbps, while 10 Gbps and, in the future, 80 Gbps devices may be available. The interconnect should also be temperature-insensitive in order for the interconnect to be incorporated onto silicon integrated circuitry. For example, as will be described in detail hereinafter, the interconnect may be top-side coupled onto CMOS-integrated components.

Recent progress in tunneling junction technology by the assignee of the present application has greatly increased the flexibility in fabrication and design of electron tunneling devices based on metal-insulator(s)-metal structures, thus allowing the fabrication of high speed electron tunneling devices (See, copending U.S. patent applications Ser. No. 09/860,988 (hereinafter, '988 application), Ser. No. 09/860, 972 (hereinafter, '972 application), Ser. No. 10/103,054 (hereinafter, '054 application), Ser. No. 10,140,545 (hereinafter '535 application) and Ser. No. 10/265,935 (hereinafter '935 application), all of which applications are incorporated herein by reference).

The electron tunneling devices as disclosed in the aforementioned '988, '972, '054, '535 and '935 applications are particularly suited for integration onto existing chips because combination of metal and insulating layers forming each electron tunneling device may be deposited directly on the chips without the need for additional semiconductor processing steps. That is, the electron tunneling devices of the aforementioned applications may be formed monolithically on existing semiconductor devices without high temperature or crystalline growth procedures. Additionally, unlike hybrid integration assemblies, in which separately-fabricated devices are surface mounted or flip-chip bonded onto existing chips, the electron tunneling devices developed by the assignee of the present invention may be formed directly on the chips themselves. Furthermore, as described in detail in the '988, '972, '054, '535 and '935 applications, the electron tunneling devices as disclosed in these applications are capable of operating at high speeds, thus enabling these devices to function in optical regimes and at high data rates. Still further, the electron tunneling devices may be integrated into the circuitry itself (i.e., formed during the fabrication procedure of the circuitry as a part of the circuitry components), if so desired. Therefore, by incorporating the electron tunneling devices of the aforementioned '988, '972, '054, '535 and '935 applications as part of an optical interconnect assembly, a high speed interconnection solution for use between components on chips, between chips and so on may be attained.

Moreover, the electron tunneling devices developed by the assignee of the present invention may be fabricated directly adjacent to a waveguide and be configured to cooperate with the waveguide so as to absorb an evanescent field portion of a lightwave traveling through the waveguide. For example, the electron tunneling device may include an antenna designed to couple light of a particular wavelength (e.g., optical wavelengths) out of the waveguide and into a tunneling junction region of the electron tunneling device. Alternatively, the electron tunneling devices may be fabricated within a waveguide so as to absorb the propagating field portion of the a lightwave traveling through the waveguide. As will be discussed in detail at an appropriate point in the text below, the concept of combining the electron tunneling devices with a waveguide is significant in that it allows the coupling of light energy into and out of the waveguide as well as the directing of light energy to electronic devices as electrical energy. This concept may be utilized to provide high speed interconnections between optical and electronic components, as will be discussed in detail immediately hereinafter.

Turning now to the drawings, wherein like components are indicated by like reference numbers throughout the various figures, attention is immediately directed to FIG. 1A, which illustrates an approach to the interconnection of two electron tunneling structures on a chip in accordance with the present invention. FIG. 1A is a diagrammatic illustration, in perspective view, of an interconnect assembly 10. Interconnect assembly 10 includes a chip 11, which includes circuitry 12 formed on top of a substrate 13. A waveguide region 14 is defined on chip 11, and a first electron tunneling device 16 and a second electron tunneling device 18 are formed on top of waveguide region 14. First and second electron tunneling devices 16 and 18 may be, for instance, high speed electron tunneling devices and variants as disclosed in the aforementioned '988, '972, '054, '535 and '935 applications, which high speed electron tunneling devices are formed of thin film layers of non-insulating and insulating materials. Waveguide region 14 may be formed, for example, of polymers, dielectric materials such as glass, fused silica and silicon-on-insulator, photonic crystals, lithium niobate, organic materials and photonic bandgap materials. In the embodiment illustrated in FIG. 1A, first and second electron tunneling devices 16 and 18 include antenna arms 20A–20B and 22A–22B, respectively, defining bowtie antennae. Other antenna designs such as, but not limited to, Vivaldi, Vee, and those designs described in the '935 application, may also be used. First and second electron tunneling devices 16 and 18 may be connected to integrated electronic components in the existing electronic circuitry (represented by squares 24 and 26) on the chip by, for example, pairs of metal lines 28A and 28B and 30A and 30B, respectively. The integrated electronic components 24 and 26 may be, for example, driver transistors or amplifier transistors.

Still referring to FIG. 1A, a number of different configurations of the interconnect assembly of the present invention are contemplated. As an example, first electron tunneling device 16 may be a modulator, as described in the '972 or '054 or '535 application, and second electron tunneling device 18 may be a detector, as described in the aforementioned '988, '972, '054, '535 and '935 applications. In this case, an external continuous wave (CW) light source (not shown) may feed a CW light, indicated by an arrow 40, into waveguide 14, then the circuitry on the chip may cause first electron tunneling device 16 (modulator) to modulate the CW light in the waveguide so as to produce a modulated light, indicated by a wavy arrow 42. The manner in which the first electron tunneling device may act as a modulator is described in detail in the aforementioned '972 and '054 applications. Waveguide region 14 may be further configured to act as an interconnect between the first electron tunneling device 16 and second electron tunneling device 18 such that second electron tunneling device 18 (detector) detects modulated light 42 to generate an electrical signal, indicated by an arrow 44. Electrical signal 44 can then be directed back into the existing circuitry on the chip or be coupled out to integrated electronic component 26. Alternatively, second electron tunneling device 18 may be configured to detect only a portion of modulated light 42 such that a slightly attenuated, output light, indicated by a wavy arrow 46, is further directed through waveguide 14 to be coupled out of the chip. As yet another alternative, second electron tunneling device 18 may be replaced by a conventional detector which is not based on electron tunneling such as, for example, a semiconductor-based detector.

Continuing to refer to FIG. 1A, interconnect assembly 10 is advantageous in that an optical means of interconnecting various devices on-chip as well as off-chip is provided without additional complications in the chip circuitry itself. As described in detail in the aforementioned '988, '972 and '056 applications, the electron tunneling devices disclosed by the assignee of the present invention may be formed of readily depositable materials, such as metals and insulators. As a result, first electron tunneling device 16 may be formed directly on top of a chip, as shown in FIG. 1A, without interference with the intended function of the integrated electronic components in the chip circuitry or displacing existing circuitry on the chip, using relatively simple, deposition and lithography, rather than semiconductor crystalline growth techniques. Also, rather than relying upon a direct, hardwire electrical connection from the portion of the chip circuitry near component 24 to that near component 26, data may be transferred between the two regions on the chip by the optical interconnection between the first electron tunneling device and the second electron tunneling device. Furthermore, modulated light 46, which contains information as encoded onto first electron tunneling device 16 acting as a modulator, may be directed onto a site away from chip 11 such that the encoded information is transmitted off-chip at optical speeds.

Figure 1B:
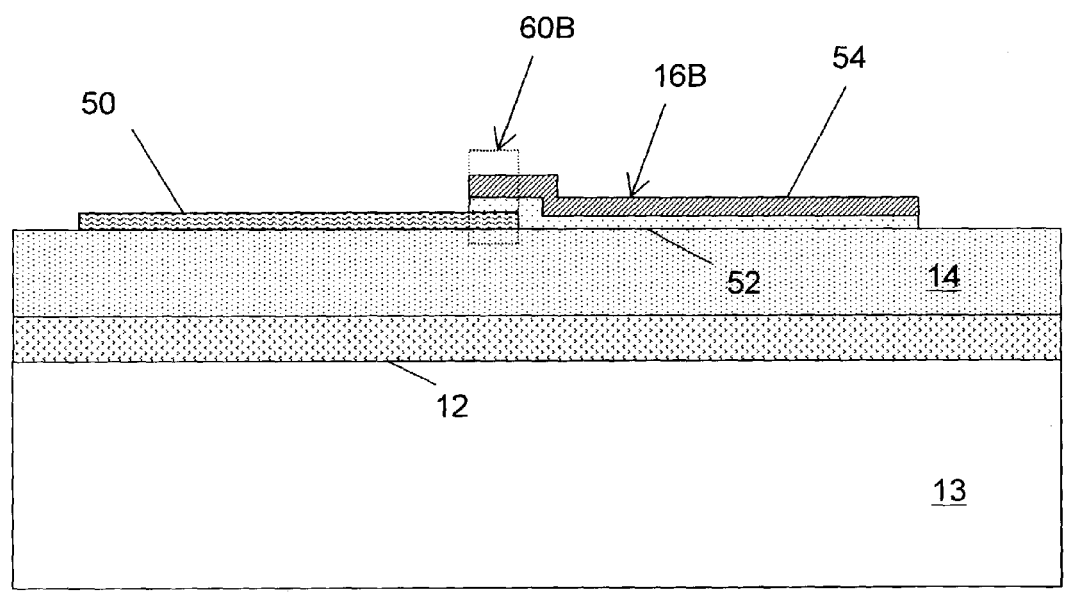
FIGS. 1B and 1C are diagrammatic illustrations, in cross-section, showing details of electron tunneling devices suitable for use in the interconnected electron tunneling device of the present invention.
Figure 1C:
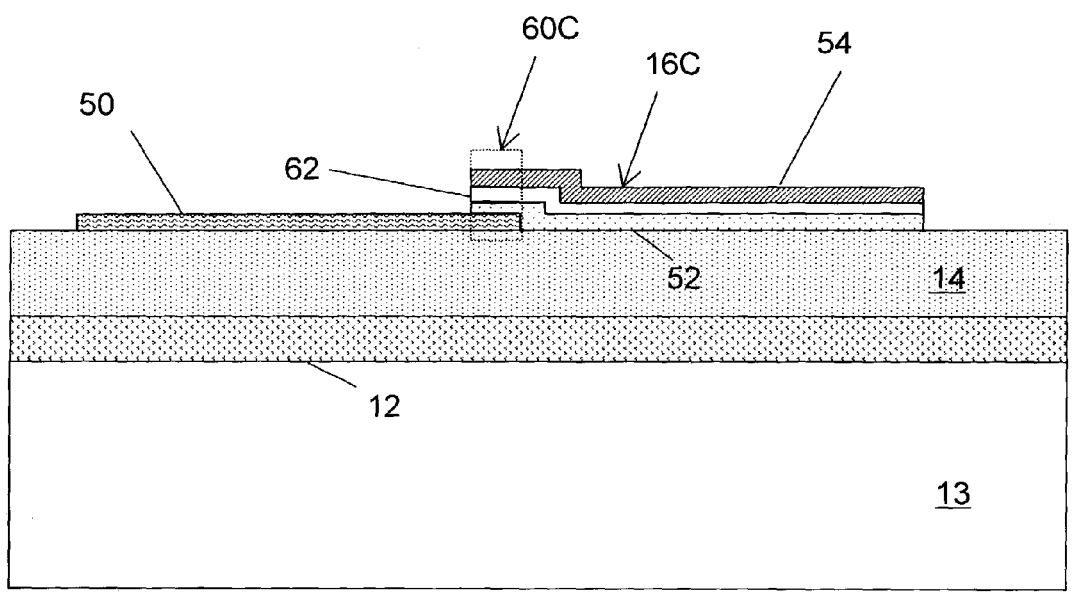

Referring now to FIGS. 1B and 1C, possible configurations for the electron tunneling devices shown in FIG. 1A are described. FIG. 1B illustrates a cross-sectional view of one embodiment of an electron tunneling device suitable for use in the interconnect assembly of the present invention as shown in FIG. 1A. This electron tunneling device is similar in design to those shown in the aforementioned '988 and '972 applications. An electron tunneling device 16B includes a first non-insulating layer 50, which forms one of the antenna arms (e.g., antenna arm 20 in FIG. 1A) of the first electron tunneling device. In the embodiment shown in FIG. 1B, first non-insulating layer 50 is deposited on top of waveguide 14, which in turn has been formed on top of circuitry 12. First non-insulating layer 50 may be, for example, a metal, semi-metal, semiconductor or superconductor. A first layer 52 is deposited also on top of waveguide 14 such that first layer 52 partially overlaps first non-insulating layer 50. First layer 52 may be, for example, an amorphous or crystalline insulating material. The portion which overlaps with first non-insulating layer 50 may be, for instance, an oxide of the first non-insulating layer or a separately deposited, amorphous insulating layer. A second non-insulating layer 54 is deposited on top of first layer 52 such that a tunneling junction region 60B is formed by the overlapping portions of first non-insulating layer 50, first layer 52 and second non-insulating layer 54. Second insulating layer 54 defines the other of the antenna arms (e.g., antenna arm 21 in FIG. 1A) of first electron tunneling device 16B, and may be formed of, for example, a metal, semi-metal, semiconductor or superconductor. In a tunneling junction region (indicated by a dashed box 60B), first and second non-insulating layers are spaced apart from one another such that a voltage (not shown) may be applied thereacross. First layer 52 is further configured to cooperate with the materials forming the first and second non-insulating layers such that electrons are allowed to travel therethrough by means of tunneling depending on the voltage placed across the first and second non-insulating layers. That is, the thickness of first layer 52 as well as the material from which the first layer is formed are selected such that first electron tunneling device exhibits the desired electron tunneling characteristics. For instance, the first non-insulating layer may be 40 nm of nickel, and the second non-insulating material may also be 40 nm of nickel, both deposited by sputtering. The first layer may consist of, for example, a layer of nickel oxide, 4 nm thick, formed by thermal oxidation.

Referring now to FIG. 1C, a variation of the electron tunneling device of FIG. 1B is illustrated. An electron tunneling device 16C is based on the structures described in the co-assigned '988 application mentioned earlier. Like electron tunneling device 16B shown in FIG. 1B, electron tunneling device 16C includes first and second non-insulating layers 50 and 54, respectively, with a first layer 52 disposed therebetween. Additionally, a tunneling region 60C of electron tunneling device 16C includes a second layer 62. As described in detail in the '988 application, the addition of second layer 62 serves to increase the nonlinearity in the current-voltage characteristics of the electron tunneling device. Moreover, the inclusion of the second layer allows the possibility of resonant tunneling as the electron transport mechanism through the electron tunneling device. Second layer 62 may be, for example, an amorphous or crystalline insulating layer. For instance, the first non-insulating layer may be 40 nm of niobium, and the second non-insulating material may be 40 nm of tantalum, both deposited by sputtering. The first layer may consist of amorphous niobium oxide, 1.5 nm thick, on top of which is deposited amorphous tantalum oxide, also 1.5 nm thick, both deposited by atomic layer deposition.

It should be noted that, the modifications shown in FIGS. 1B and 1C may be applied to one or both of first and second electron tunneling devices 16 and 18 of FIG. 1A. Additional modifications, such as the addition of three or more adjacent insulating layers or a combination of metal and insulating layers between the first and second non-insulating layers as shown in FIGS. 1B and 1C, are also contemplated and discussed in the aforementioned co-assigned U.S. patent applications.

Figure 1D:
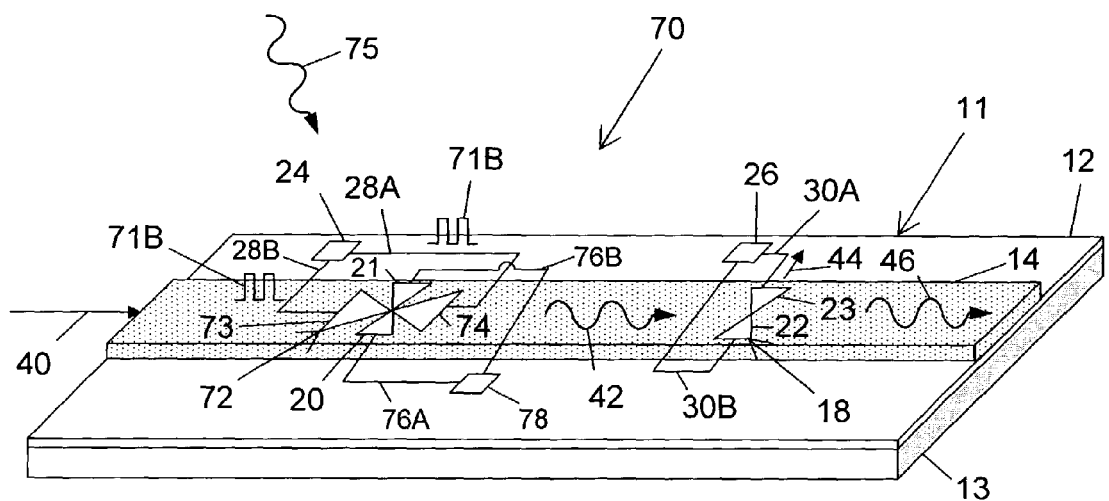
FIG. 1D is a diagrammatic illustration, in perspective view, of an alternative embodiment of an interconnected electron tunneling device of the present invention, shown here to illustrate the use of a double antenna electron tunneling device.
Figure 1E:
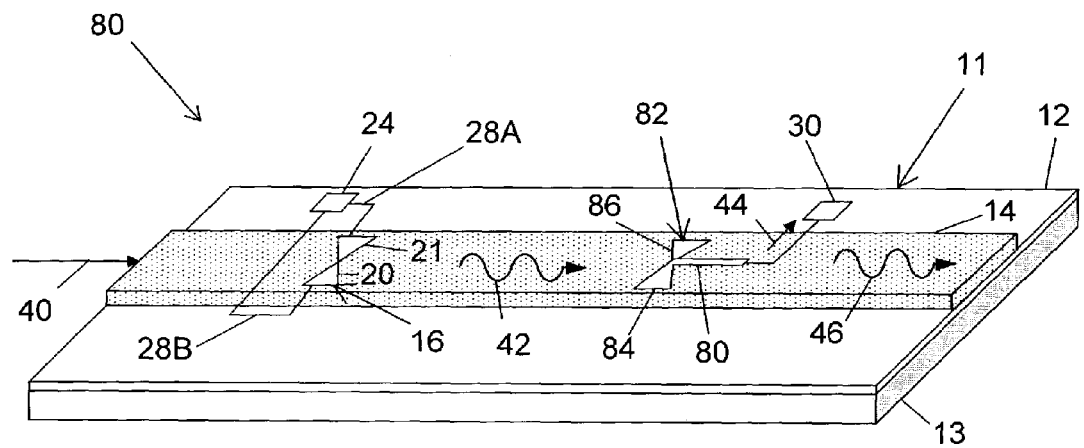
FIGS. 1E and 1F are diagrammatic illustrations, in perspective view, of additional embodiments of an interconnected electron tunneling device of the present invention, shown here to illustrate the use of surface plasmon devices.
Figure 1F:
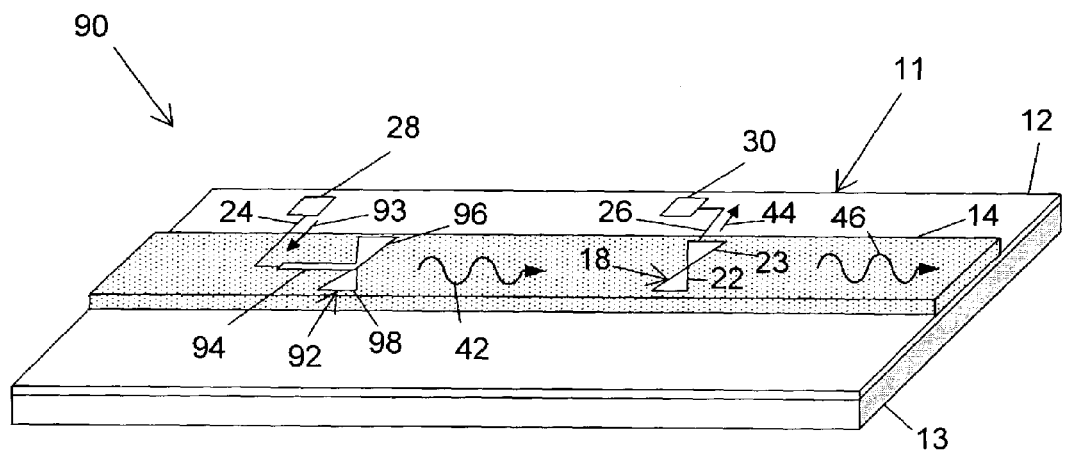

Additional variations on the interconnect assembly of the present invention are shown in FIGS. 1D–1F. FIG. 1D is similar to the interconnect assembly shown in FIG. 1A, but first electron tunneling device 16 has been replaced with an electron tunneling modulator 72. Electron tunneling modulator 72 includes first and second pairs of antenna arms. First pair of antenna arms 20 and 21 is essentially the same as that shown in, for example, FIG. 1A, and is designed to receive input light 40 and modulate it so as to produce modulated light 42. As discussed in reference to FIGS. 1B and 1C, antenna arms 20 and 21 may be configured to overlap such that a tunneling junction region (not shown) is formed. Electrical signals 71A and/or 71B may be provided via wires 28A and 28B, respectively, as a modulation signal so as to vary the electron transport characteristics of the tunneling junction region, thus yielding the modulated light in accordance with the modulation signal. Electron tunneling device 72 further includes a second pair of antenna arms 73 and 74, which may be configured to receive an optical modulation input 75. Optical modulation input 75 acts as an optical modulation signal to vary the electron transport characteristics of the tunneling junction region, thus, again, such that electron tunneling device 72 yields modulated light 42 in accordance with the optical modulation signal. Details of such a crossed-bowtie antenna modulator are disclosed in the aforementioned '972 application. Additionally, second pair of antenna arms 73 and 74 may be connected with an integrated electronic component 78 in circuitry 12 via wires 76A and 76B.

FIG. 1E shows yet another alternative embodiment of an interconnect assembly 80, this time using a surface plasmon device of the '054 application as a detector device, in place of second electron tunneling device 18 in interconnect assembly 10 of FIG. 1A. A surface plasmon device 82 includes a pair of antenna arms 84 and 86, which are configured to receive modulated light 42 from first electron tunneling device 16. Antenna arms 84 and 86 direct the modulated light so received into a surface plasmon waveguide region 88 as surface plasmon waves. Surface plasmon waveguide region 88 then provides electrical signal 44 in accordance with the received modulated light.

As yet another alternative, an interconnect assembly 90, as shown in FIG. 1F, may include a surface plasmon device 92 acting as an emitter, such as described in the '054 application. For instance, in interconnect assembly 90 as shown in FIG. 1F, surface plasmon device 92 receives an electrical signal 93 from integrated electrical component 28, which is a part of the chip circuitry. The received electrical signal generates surface plasmon waves (not shown) in a surface plasmon waveguide region 94. A pair of antenna arms 96 and 98 of surface plasmon device 92 acts as an emitter antenna to emit the generated surface plasmon waves as an output light 46.

FIGS. 1A–1F illustrate interconnect assemblies in which light coupling from the waveguide into and out of electron tunneling devices and surface plasmon devices is performed using antennae. It should be noted that other light coupling schemes are also possible. For example, as disclosed in the '054 application, surface plasmon evanescent couplers and grating couplers may also be used in the interconnect assembly of the present invention.

Figure 2A:
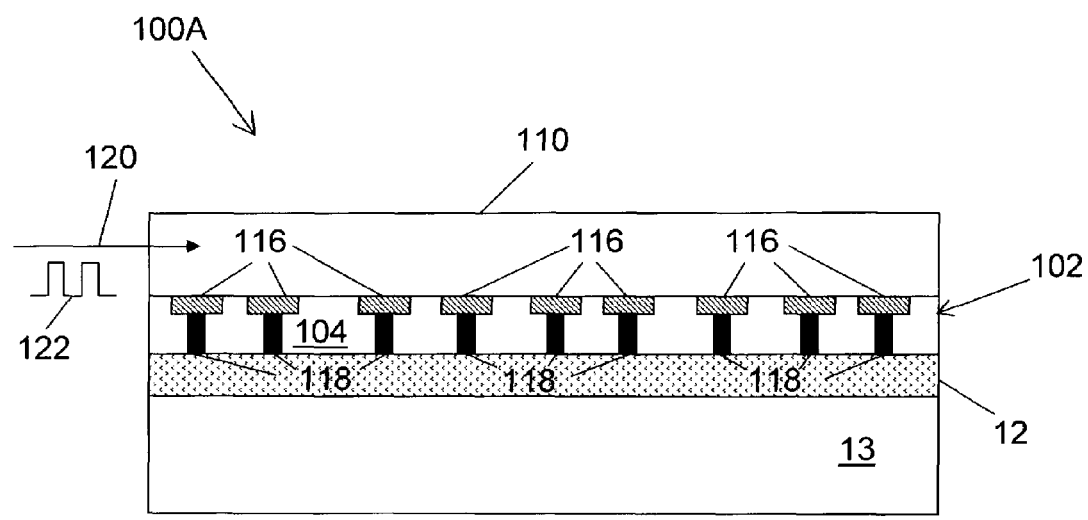
FIGS. 2A and 2B are diagrammatic illustrations, in cross-section, of embodiments of an edge-fed, optical clock distribution scheme of the present invention.
Figure 2B:
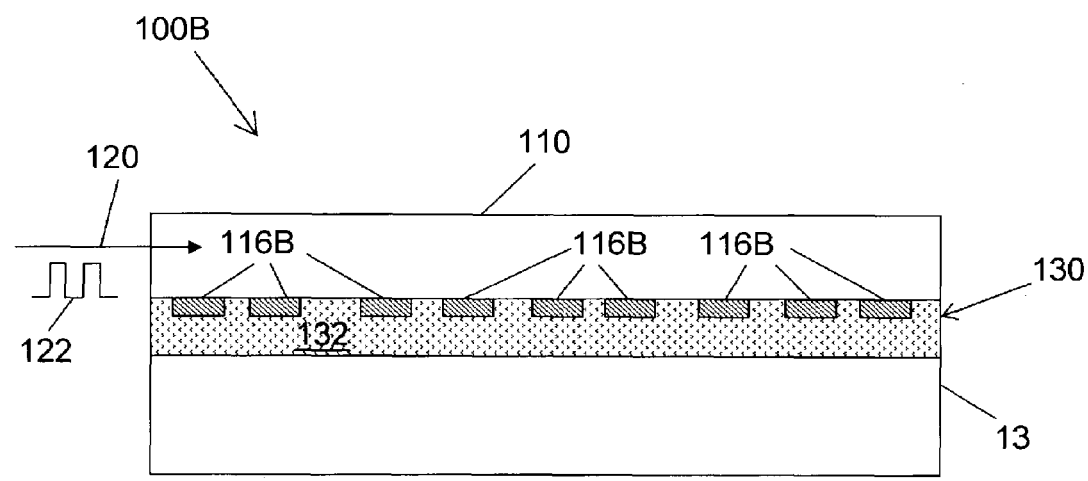

An application of the interconnect assembly of the present invention is shown in FIGS. 2A and 2B. FIG. 2A illustrates a cross-sectional view of an integrated circuit chip 100A including an optical clock distribution configuration. Integrated circuit chip 100A includes circuitry 12 disposed on substrate 13 as discussed earlier. Integrated circuit chip 100A also includes a tunneling device layer 102 based on an insulator 104 with a waveguide layer 110 disposed thereon. Tunneling device layer 102 includes two or more electron tunneling devices 116, which are connected to circuitry 12 through, for example, vias 118. Each one of the electron tunneling devices may be configured as a detector as described, for example, in the '988, '972 and '054 applications. In the integrated circuit chip shown in FIG. 2A, an optical signal 120, carrying a clock signal shown as a waveform 122, is edge-coupled into waveguide layer 110. Optical signal 120 may have a sufficiently long wavelength (e.g., 1550 nm) such that the optical signal is not absorbed by, for example, a silicon substrate or silicon components in the circuitry but only by the electron tunneling devices. As optical signal 120 is guided through waveguide layer 110, each one of electron tunneling devices 116 detects a portion of the optical signal, converts the optical signal into an electrical signal (not shown) and communicates the electrical signal to circuitry 12. In this way, the clock signal encoded onto optical signal 120 is very quickly distributed across the entire chip with minimal clock phase skew.

A variation of the optical distribution configuration of FIG. 2A is illustrated in FIG. 2B, showing a cross-sectional view of an integrated circuit chip 100B. Like integrated circuit chip 100A of FIG. 2A, integrated circuit chip 100B includes substrate 13 and waveguide 110, but the electronic circuitry and electron tunneling device layers have been combined. A combination layer 130 includes circuitry 132 with electron tunneling devices 116 monolithically integrated thereon such that electron tunneling devices 116B are disposed alongside electrical components (not individually shown) in the circuitry layer. Electron tunneling devices 116B may be formed during the same fabrication steps as those used to form circuitry 132 or may be formed separately following the fabrication of circuitry 132.

The optical clock distribution configurations shown in FIGS. 2A and 2B present an improvement over the conventional, electrical clock distribution schemes, in which clock signals are provided as electrical signal through electrical lines that take up chip real estate, produce significant clock skew and produce electromagnetic pickup. The optical clock distribution configurations of FIGS. 2A and 2B avoid these problems inherent to electrical clock signals by taking advantage of the fact that the interconnect assembly of the present invention, including the electron tunneling devices and waveguide, may be added on top of an existing integrated circuitry chip. It is often a difficult task in chip layout design to ensure that the clock signal reaches all parts of the chip simultaneously without degradation and while maintaining a constant phase across the chip. Since optical signals in waveguides travel much more quickly and more directly than electrical signals in electrical lines, an optical clock signal may be distributed over the chip much more quickly than an electrical clock signal. The optical clock signal broadcast into the waveguide layer may be picked up by the electron tunneling devices through, for instance, vias where needed.

Figure 3A:
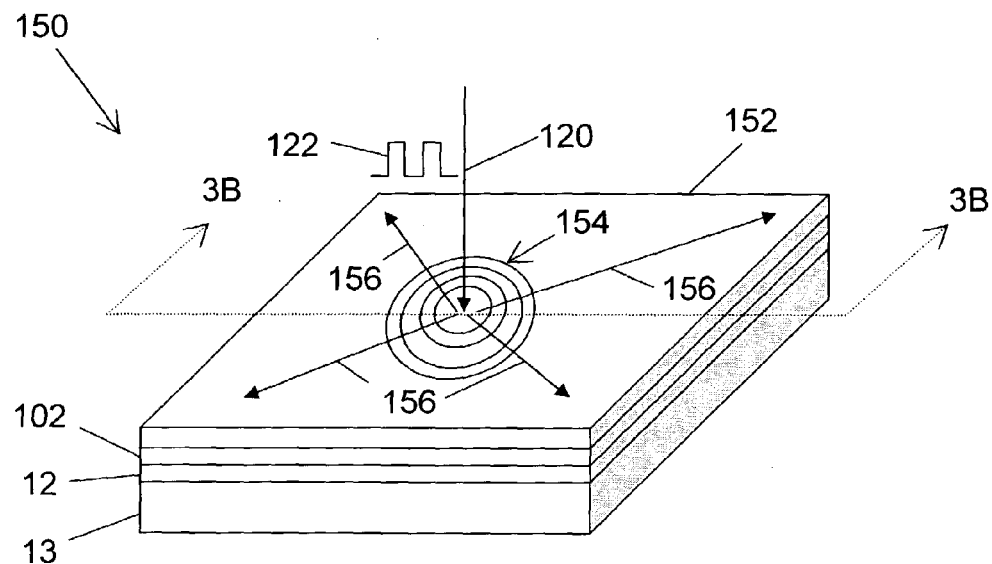
FIGS. 3A and 3B are diagrammatic illustrations of a top-fed, optical clock distribution scheme of the present invention.
Figure 3B:
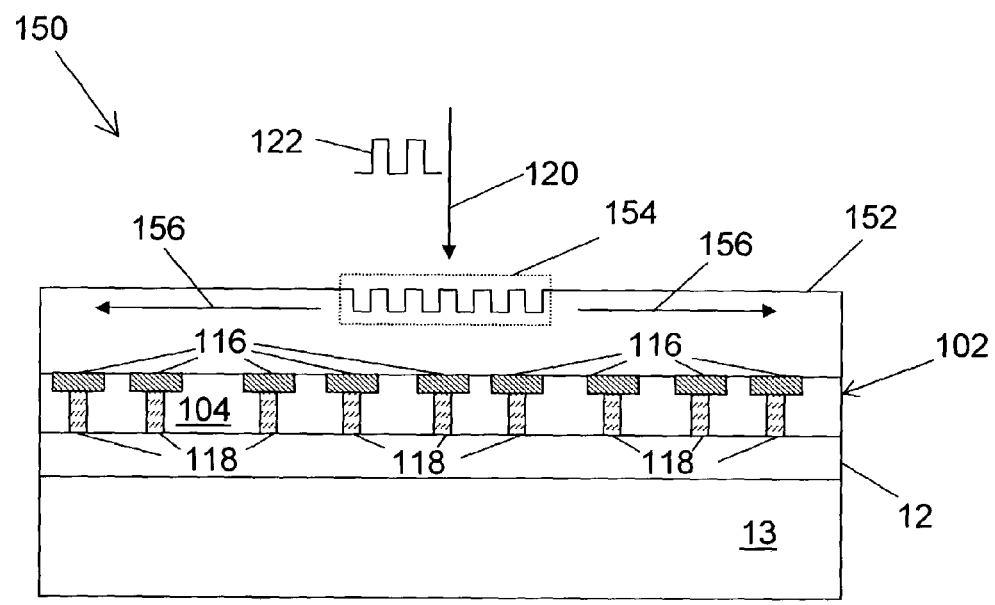

Various modifications to the optical clock distribution configuration of FIGS. 2A and 2B are contemplated. One such example is shown in FIGS. 3A and 3B. Like previously discussed embodiments of the present invention, an integrated circuit chip 150 shown in FIG. 3A includes circuitry 12 on top of a substrate 13. Like integrated circuit chip 100A of FIG. 2A, integrated circuit chip 150 also includes tunneling device layer 102. Integrated circuit chip 150 further includes a modified waveguide layer 152, which is designed to receive optical signal 120 carrying a clock signal 122 when the optical signal is incident normally on modified waveguide layer 152. A grating coupler 154, which is integrated into modified waveguide layer 152, couples optical signal 120 into modified waveguide layer 152 such that optical signal 120 is radially broadcast throughout modified waveguide layer 152 as an optical clock signal (represented by arrows 156).

Details of modified waveguide layer 152 as well as tunneling device layer 102 are more readily apparent in FIG. 3B, which illustrates integrated circuit chip 150 in cross section. As shown in FIG. 3B, modified waveguide layer 152 includes grating coupler 154, which is designed to receive optical signal 120 and to direct the optical signal so received throughout modified waveguide layer 152 as optical clock signal 156. Optical clock signal 156 is picked up by electron tunneling devices 116 at desired points across the integrated circuit chip. Electron tunneling devices 116 then communicate the optical clock signal to electrical components in the circuitry wherever needed.

As in the case of integrated circuit chip 100A of FIG. 2A, the optical clock distribution scheme used in integrated circuit chip 150 is advantageous because the optical clock signal is distributed over the entire chip within picoseconds without being hampered by electrical delays. As a result, the clock signal received at the chip circuitry does not experience significant delay that may cause phase differences in different part of the chip. Also, since the optical clock signal is transmitted optically and is converted to an electrical signal by an electron tunneling device only where needed, electromagnetic pickup is reduced in comparison to conventional, electrical clock distribution through electrical transmission lines.

Various modifications to the optical clock distribution schemes shown in FIGS. 2A–2B and 3A–3B are possible. For example, the optical clock signal may be broadcast over the integrated circuit chip through free-space and subsequently picked up by the electron tunneling devices at various locations on the integrated circuit chip. Such a free-space transmission scheme may include, for instance, additional optical components such as lenses, holographic optical elements and filters. Other modifications may be apparent to those skilled in the art while remaining within the spirit of the present invention.

Figure 4A:
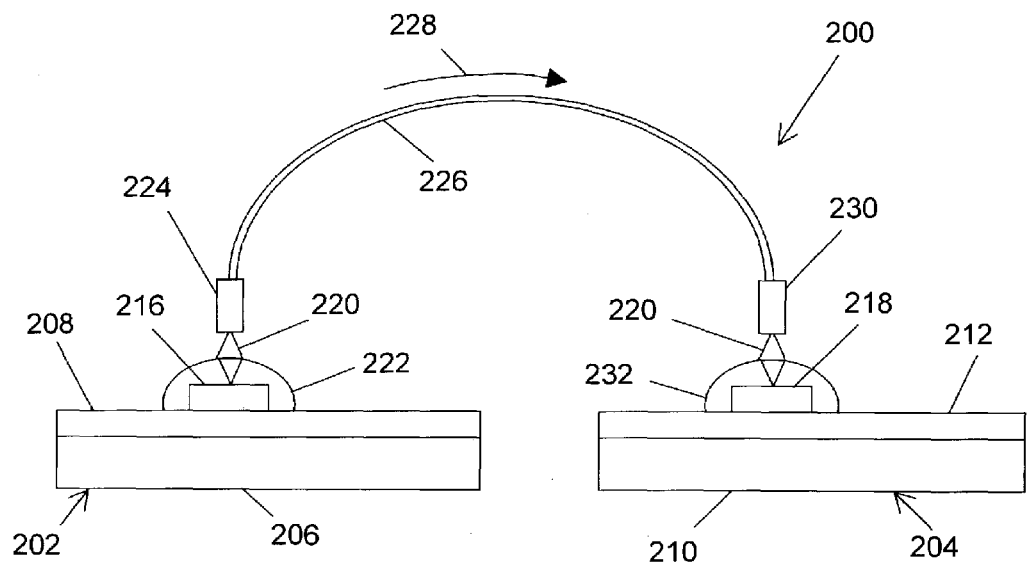
FIGS. 4A–4D are diagrammatic illustrations of another interconnected electron tunneling device of the present invention, shown here to illustrate embodiments including optical fiber as the interconnection between devices on separate chips.
Figure 4B:
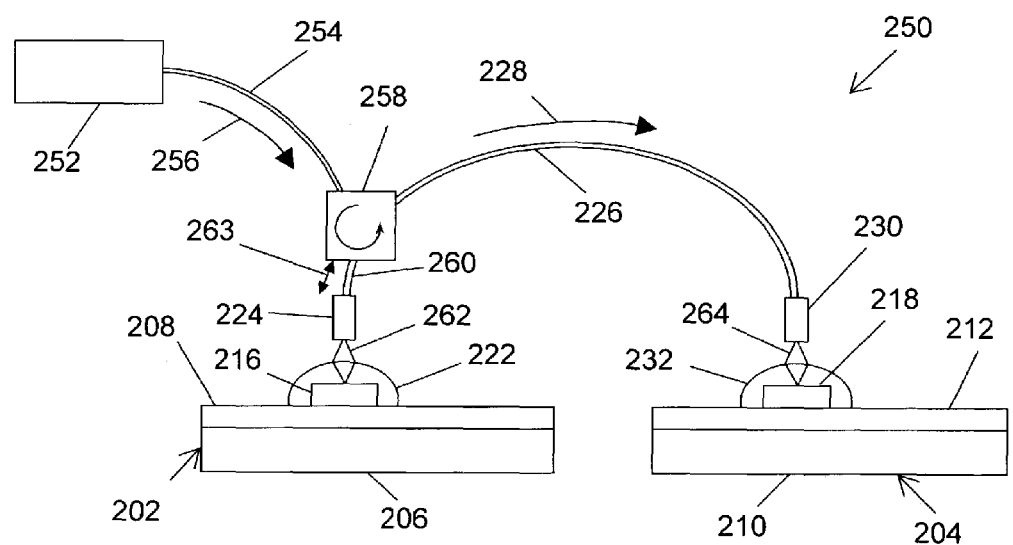

Turning now to FIGS. 4A and 4B, still other alternative embodiments of an interconnect assembly of the present invention using optical fibers are illustrated. FIG. 4A shows an interconnect assembly 200. Interconnect assembly 200 includes first and second chips 202 and 204, respectively. First chip 202 includes a substrate 206, on which circuitry 208 is formed. Similarly, second chip 204 includes a substrate 210 with circuitry 212 formed thereon. The first and second chips further include a first electron tunneling device 216 and a second electron tunneling device 218, respectively, formed thereon. In the embodiment as shown in FIG. 4A, first electron tunneling device 216 is configured to act as an emitter, such as those disclosed in the patent applications referenced above. First electron tunneling device 216 emits a light beam 220, which is focused by a first lens arrangement 222 onto an optical fiber input 224. Light beam 220 is then transmitted through an optical fiber 226 in the direction indicated by an arrow 228 toward an optical fiber output 230. At optical fiber output 230, light beam 220 is then focused by a second lens arrangement 232 onto second electron tunneling device 218. For instance, second electron tunneling device 218 may be an electron tunneling device, as disclosed in the '988, '972, '054, '535 and '935 applications, which is configured to act as a detector so as to receive light beam 220. Alternatively, a conventional detector, such as a silicon-based detector, may be used as second electron tunneling device 218. In this way, an optical interconnection is established between devices on first and second chips 202 and 204, thereby allowing transfer of data therebetween. Such an optical interconnection is advantageous over, for example, electrical interconnections in terms of speed, signal loss, propagation distance and drive power.

FIG. 4B shows an alternative embodiment of an interconnect assembly using optical fiber. An interconnect assembly 250 is similar to interconnect assembly 200 of FIG. 4A with a number of key differences. Interconnect assembly 250 includes a laser 252 configured to direct an input laser light (not shown) through an input optical fiber 254 in the direction indicated by an arrow 256. Input optical fiber 254 directs the input laser light into an optical circulator 258, which then directs the input laser light through a fiber segment 260 toward first electron tunneling device 216. In the embodiment shown in FIG. 4B, first electron tunneling device 216 is configured to act as a reflective modulator, which receives and modulates the input laser light. As a result, a light beam 262 as shown in FIG. 4B includes both the input laser light and a modulated light (not shown) as reflected from first electron tunneling device 216 such that fiber segment 260 contains light traveling into and out of circulator 258, as indicated by a double-headed arrow 263. Circulator 258 is configured such that any light entering the circulator from input optical fiber 254 is directed into fiber segment 260 while light entering the circulator from fiber segment 260 is directed toward optical fiber 226 in direction 228. In this way, modulated light from first electron tunneling device 216 is directed through optical fiber 226 and detected at second electron tunneling device 218. It is noted that multi-mode optical circulators are not commercially available at the current state of technology. Therefore, input optical fiber 254 and fiber segment 260 shown in FIG. 4B would be required to be single mode fibers if single mode circulators are used. However, it is anticipated that future development of a multi-mode optical circulator would enable the interconnect scheme of FIG. 4B to be compatible with multi-mode optical signal transmission, therefore the use of single mode optical fiber as well as the use of multi-mode optical fiber in the configuration shown in FIG. 4B are considered to be within the spirit of the present invention. Alternatively, the optical circulator may be replaced by an optical coupler, albeit with loss of optical power into fiber 226.

Still referring to FIG. 4B, first electron tunneling device 216 may be configured to receive a modulation signal from on-chip circuitry 208. Consequently, data from circuitry 208 may be encoded onto the modulated light produced at first electron tunneling device 216 and optically transmitted at high speeds to devices on chip 204 by way of second electron tunneling device 218. Also, second electron tunneling device 218 may be configured with a second optical circulator such that light reflected by second electron tunneling device 218 may be passed down a chain or around a token ring.

Figure 4C:
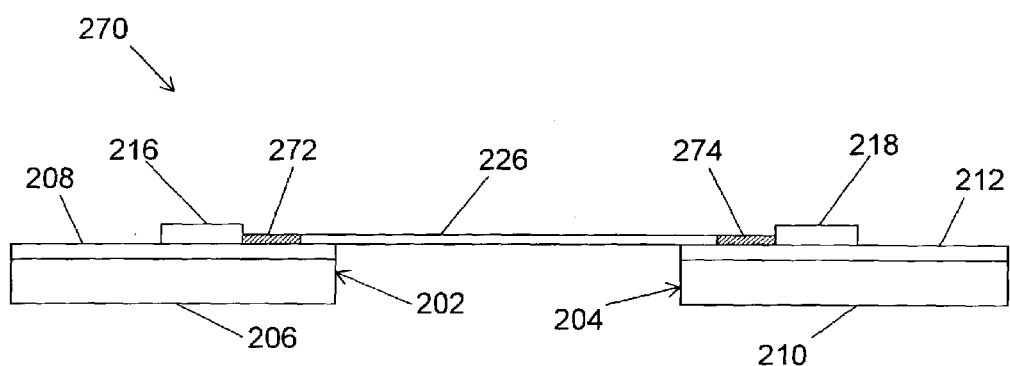
Figure 4D:
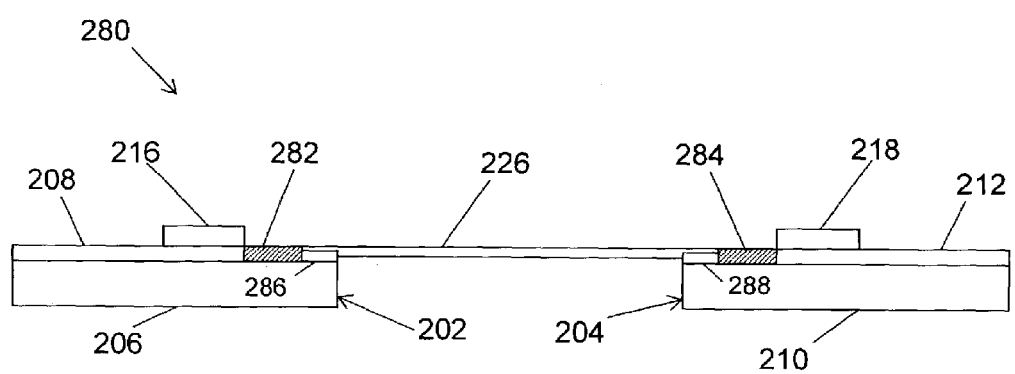

Alternative optical interconnect configurations using optical fiber are shown in FIGS. 4C and 4D. As shown in FIG. 4C, an interconnect assembly 270 includes first and second chips 202 and 204, respectively. In addition, interconnect assembly 270 includes first and second waveguides 272 and 274, which are connected with first and second electron tunneling devices 216 and 218, respectively. First and second waveguides 272 and 274 couple light into or out of the electron tunneling devices such that light from the electron tunneling devices may be fed into optical fiber 226 and vice versa. For instance, if first electron tunneling device 216 is configured as an emitter (as described, for example, in the '972 or 'the '054 application), light emitted by first electron tunneling device 216 is coupled through first waveguide 272 and into one end of optical fiber 226. The light then travels through optical fiber 226 and, at an opposing end of the optical fiber, is coupled through second waveguide 274 and into second electron tunneling device 218, which receives the transmitted light. Optical fiber 226 may be, for example, butt-coupled to first and second waveguides 272 and 274, which are disposed on top of circuitry 208 and 212, respectively, as shown in FIG. 4C. Instead, the waveguides may be embedded in the chip circuitry, as shown in FIG. 4D as first and second waveguides 282 and 284. Additionally, alignment aids, such as first and second v-grooves 286 and 288, may be included in the chips to assist in the alignment of the optical fiber with respect to the waveguides.

Figure 5:
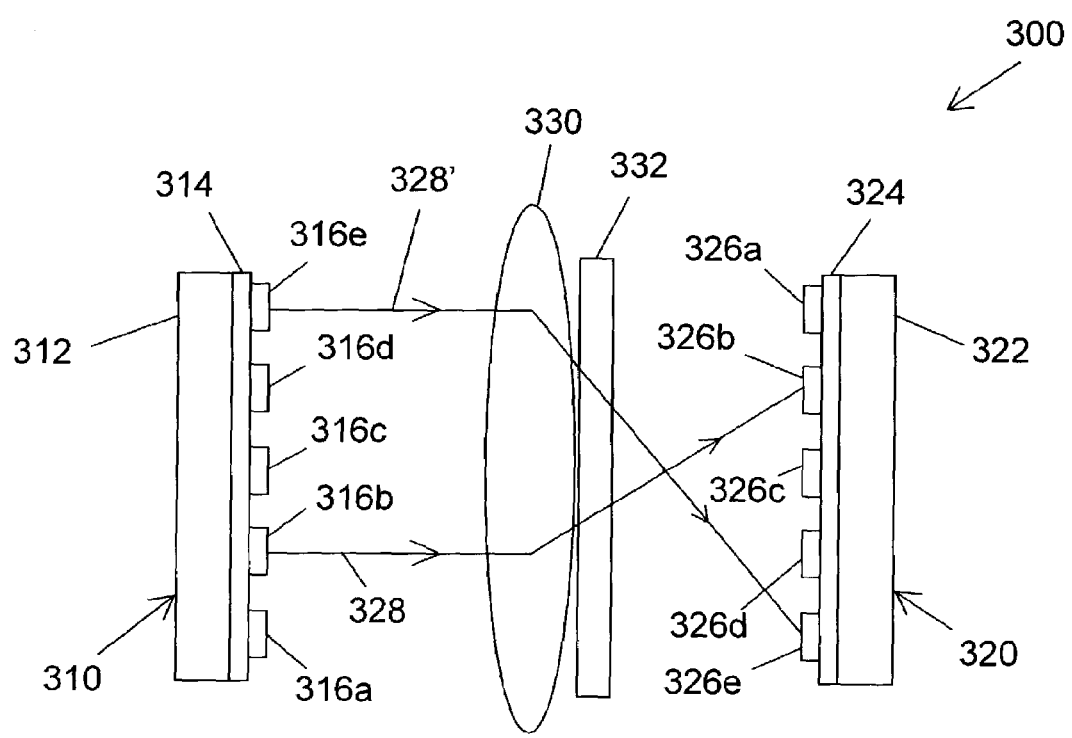
FIG. 5 is a diagrammatic illustration of still another interconnected electron tunneling device in accordance with the present invention, shown here to illustrate the use of free-space optical interconnection between electron tunneling devices on separate chips.

Yet another alternative embodiment of an interconnect assembly is shown in FIG. 5. FIG. 5 illustrates an interconnect assembly 300 in a free space optical interconnect scheme. Interconnect assembly 300 includes a first chip 310, which includes a first substrate 312 and first circuitry 314. A first plurality of electron tunneling devices 316a–316e are disposed on first circuitry 314. Interconnect assembly 300 also includes a complementary, second chip 320, which includes a second substrate 322, second circuitry 324 and a second plurality of electron tunneling devices 326a–326e formed thereon. In the embodiment shown in FIG. 5, first chip 310 and second chip 320 are positioned such that first plurality of electron tunneling devices 316a–316e on chip 310 are spaced apart from and in opposing relationship with second plurality of electron tunneling devices 326a–326e on chip 322. For instance, first plurality of electron tunneling devices 316a–e are configured to each emit a light beam of at least a given frequency, indicated by arrows 328 and second plurality of electron tunneling devices 326a–326e are configured to detect light of at least the given frequency. Interconnect assembly 300 further includes a lens arrangement 330, which is configured to direct light from each of first plurality of electron tunneling devices 316a–316e to a corresponding one of second plurality of electron tunneling devices 326a–326e. For instance, as shown in FIG. 5, lens 330 is designed such that light beam 328 emitted by electron tunneling device 316*b* on chip 310 is directed to electron tunneling device 326*b* on chip 320. Moreover, one or more additional optical components, as represented by a component 332, may also be included to perform additional optical operations. For example, component 332 may be another lens, filter, holographic optical element, reflector, grating, transmissive spatial light modulator, etc. In this way, data may be transferred optically from chip 310 to chip 320 through a free space optical interconnect scheme.

Various modifications to the free space, interconnect assembly of FIG. 5. Optical components, such as mirrors and beamsplitters, may be added to enable a non-parallel configuration of the chips. Also, lens arrangement 330 may be configured to cooperate with the electron tunneling devices on chips 310 and 320 such that operation of the interconnect assembly in the reverse direction is possible. That is, it is possible to configure the second plurality of electron tunneling devices on chip 320 to act as emitters and configure the first plurality of electron tunneling devices on chip 310 to act as detectors so as to enable the transfer of data from chip 320 to chip 310. Also, component 332 may be configured as, for instance, a waveguide including a grating or evanescent coupler such that at least portions of light beams 328 and 328' may be transferred out of interconnect assembly 300. In this case, an additional light beam (not shown) may also be inserted into the interconnect assembly at component 332 configured as a waveguide. Furthermore, the free space interconnect assembly of FIG. 5 may be combined, for instance, with the optical clock distribution schemes illustrated in FIGS. 2, 3A and 3B such that, rather than having an optical clock signal be indiscriminately broadcast over the entire chip, the optical clock signal may be selectively imaged onto specific electron tunneling devices on the chip.

As described above, the interconnect assembly of the present invention, including electron tunneling devices, is advantageous due to the high speed and integrability with silicon devices (such as chips). The interconnect assembly of the present invention allows high speed interconnection between components on a chip, between chips, between boards and racks, etc., by taking advantage of high speeds possible in the optical regime. It should be noted that an important benefit of the approach of the present invention involving the use of electron tunneling devices in optical interconnect arrangements is the fact that the present invention takes advantage of the ability of the electron tunneling devices to detect, modulate or emit light directly into or out of a waveguide or optical fiber. That is, the electron tunneling device technology developed by the assignee of the present invention allows efficient coupling and conversion between optical and electrical signals in a compact configuration which is compatible with existing integrated circuit chip technology. This feature is in contrast to conventional silicon devices with waveguides, in which light traveling through the waveguide must be redirected away from the waveguide and into the silicon in order to be detected or otherwise acted upon.

It is notable that the electron tunneling devices, for example as shown in FIGS. 1A–1F, 2A–2B and 3A–3B, may be fabricated directly adjacent to a waveguide to allow fast, guided transmission of optical signals from one electron tunneling device to another. Furthermore, the electron tunneling devices may be used to couple light energy into and out of the waveguide as well as to direct light energy to electronic devices as electrical energy. Further details of such waveguide-coupled assemblies are discussed in further detail immediately hereinafter.

Figure 6A:
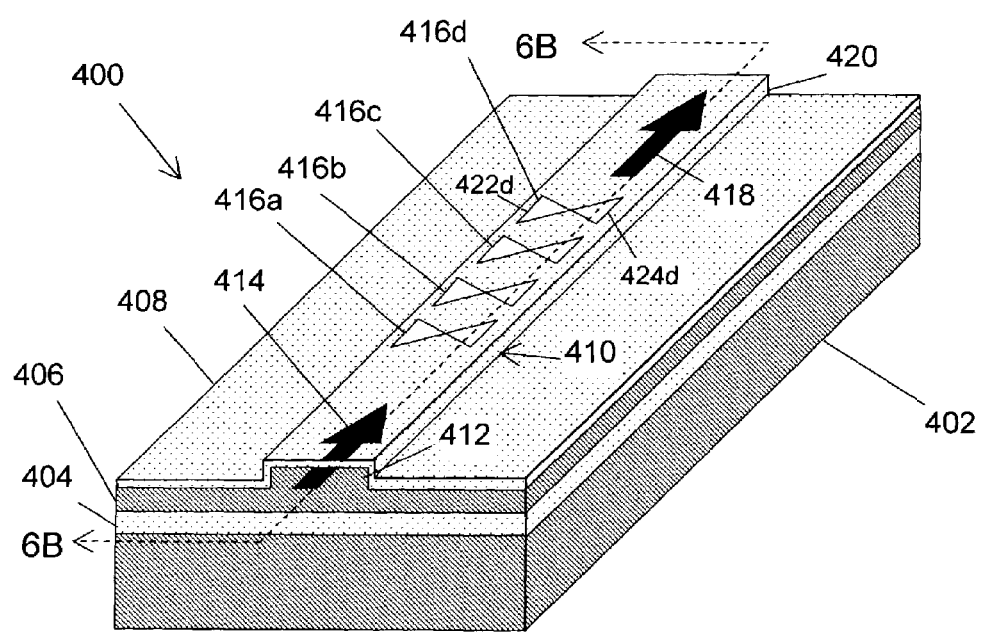
FIGS. 6A–6E are diagrammatic illustrations of a waveguide-coupled device of the present invention, shown here to illustrate various embodiments of the coupling of electron tunneling devices with a waveguide, as used in the aforementioned interconnected electron tunneling devices.
Figure 6B:
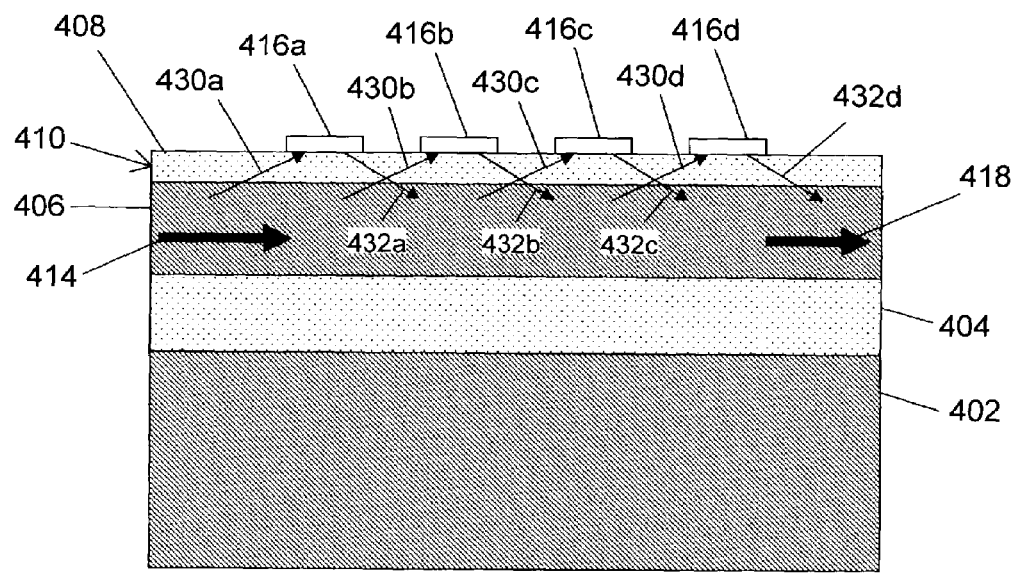

Turning now to FIGS. 6A and 6B, a waveguide-coupled assembly 400 fabricated in accordance with the present invention is illustrated. Waveguide-coupled assembly 400 includes a substrate 402, which supports a first insulating layer 404. For example, substrate 402 may be formed of silicon, while insulating layer 404 is formed of silicon dioxide. Waveguide-coupled assembly 400 further includes an optical waveguide layer 406 and a second insulating layer 408. Optical waveguide layer 406 and second insulating layer 408 cooperate to define a raised, rib waveguide section 410. Rib waveguide section 410 includes an optical input end 412, which directs input light incident thereon (indicated by an arrow 414) into the rib waveguide section. Waveguide-coupled assembly 400 further includes at least one electron tunneling device 416, which is formed on top of rib waveguide section 410. Electron tunneling device 416 is designed to receive a portion of input light 414, modulate the received portion of the input light, and produce a modulated, output light (indicated by an arrow 418), which output light 418 is directed toward an optical output end 420. For instance, bowtie antenna arms 422 and 424 of electron tunneling device 416 may be formed in a particular shape and size so as to pick up a portion of the input light of a given wavelength. Different antenna designs may also be used to optimize coupling to particular waveguide modes, such as transverse-magnetic and transverse-electric modes. Alternatively, other coupling arrangements, such as grating couplers, may be used in place of an antenna in electron tunneling device 416. Also, a coupling arrangement and an electron tunneling component may be formed at physically separate locations while still being connected with each other such that an optical or electrical signal may be communicated therebetween. Electron tunneling device 416 may be a modulator fabricated in accordance with the disclosure in the aforementioned '988, '972, '054, '535 and '935 applications. As a possible variation, waveguide-coupled assembly 400 of FIG. 6A is shown to include a linear array of four electron tunneling devices 416 to provide additional interaction with an evanescent light field portion of the input light so as to provide output light 418 having a desired degree of modulation. More or fewer electron tunneling devices may be used in a linear or two-dimensional array such that the resulting waveguide-coupled assembly provides a particular function. That is, by using more than one electron tunneling devices in the waveguide-coupled assembly, the interaction length between the input light and the electron tunneling devices may be effectively increased. Coupling between the antenna and waveguide may also be controlled by varying the spacing or cladding thickness between antenna and waveguide core. Any combination of the aforedescribed variations is also considered to be within the scope of the present invention.

It should be noted that, although waveguide-coupled assembly 400 of FIG. 6A is shown to include a silicon-on-insulator rib waveguide, other waveguide types, such as buried waveguides, fully etched waveguides, or photonic crystal waveguides, and different waveguide materials, such as glass or polymer, may also be used. In many instances, higher index and thinner waveguides couple more efficiently to the antenna and also take up less space on chip.

An example of the interaction of the electron tunneling devices with the input light is discussed in reference to FIG. 6B, showing a cross-sectional view of waveguide-coupled assembly 400 of FIG. 6A. As shown in FIG. 6B, electron tunneling devices 416*a*–416*d* pick up evanescent field portions of input light 414 (shown as arrows 430*a*–430*d*), modulate the received portions, then re-transmit modulated light (indicated by arrows 432a–432d) back into waveguide layer 406 so as to provide modulated, output light 418. Evanescent coupling between the rib waveguide region and the electron tunneling devices is particularly efficient for thin, high index waveguides.[3]

Continuing to refer to FIGS. 6A and 6B, it is noted that further modifications to waveguide-coupled assembly 400 are possible. For example, each of electron tunneling devices 416a–416d may be configured to pick up a different wavelength of input light such that waveguide-coupled assembly 400 acts as a wavelength-dependent modulator of input light, which input light may include a variety of wavelengths. Alternatively, one or more of electron tunneling devices 416a–416d may be configured as a detector (see, for example, aforementioned '988, '972 and '054 applications) so as to receive a portion of the input light and generate an electrical signal in accordance with the input light so received, which electrical signal may be directed to an electronic device located off of substrate 402 or also supported on the substrate. As yet another alternative, one or more of electron tunneling devices 416a–416d may be configured as an amplifier (see, for instance, aforementioned '972 and '054 applications) so as to receive a portion of the input light or a portion of modulated light, as produced by another of the electron tunneling devices, and produce an amplified output light. In still another alternative, one or more of the electron tunneling devices may be configured as an emitter (see, for example, aforementioned '972 and '054 applications) so as to emit additional light into the rib waveguide region to contribute to the output light. Still further, one or more of the electron tunneling devices may be configured to re-emit the portion of input light received at that electron tunneling device, for example, in a direction away from the waveguide and the substrate so as to produce a free-space optical signal in accordance with the input light. As yet another option, one or more of the electron tunneling devices may be configured to receive free-space illumination and re-transmit the received optical energy into the waveguide.

Figure 6C:
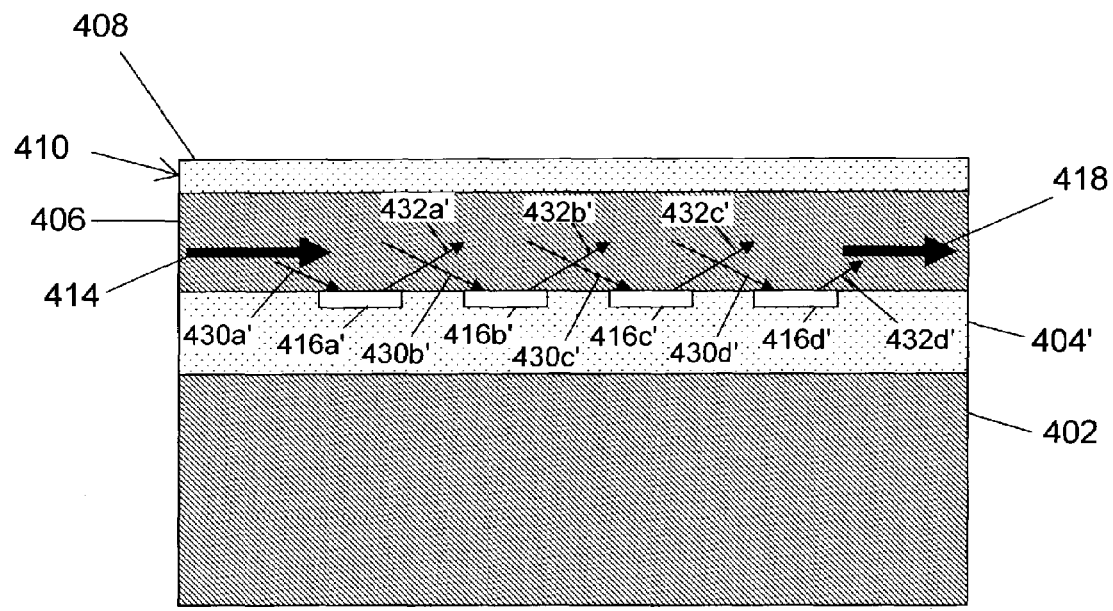
Figure 6D:
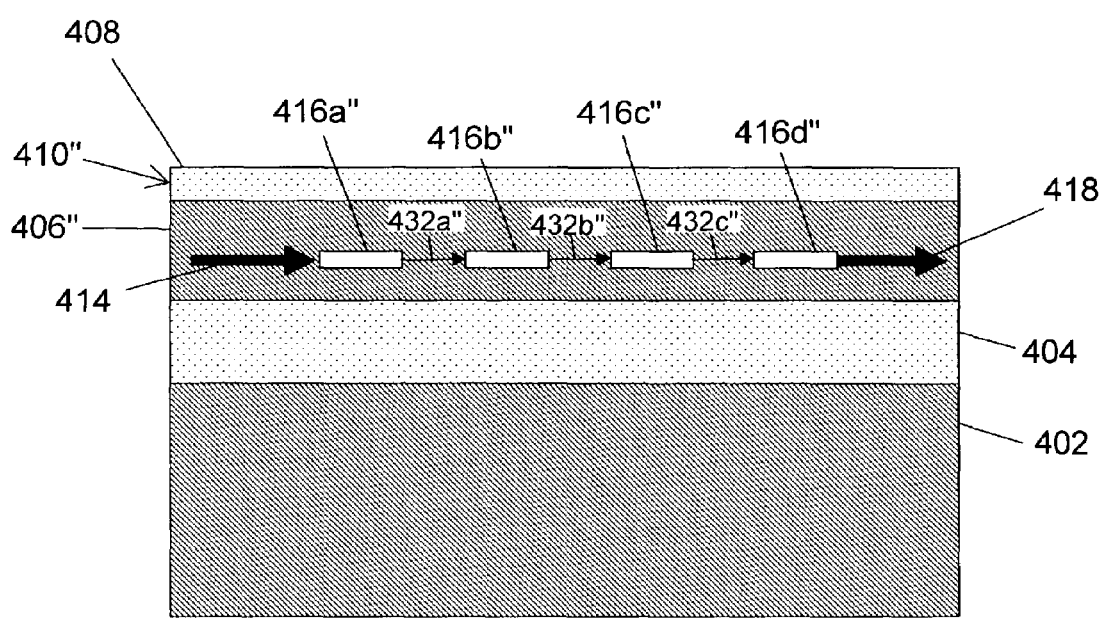

FIGS. 6C and 6D illustrate still more alternative configurations to waveguide-coupled assembly 400 shown in FIGS. 6A and 6B. For example, as shown in FIG. 6C, modified electron tunneling devices 416a'–416d' are integrated into a modified insulating layer 404', rather than being formed on top of rib waveguide section 410. As in the embodiment illustrated in FIGS. 6A and 6B, the modified electron tunneling devices also couple to evanescent field portions of input light 414 (shown as arrows 430a'–430d'), modulate the received portions, then re-transmit modulated light (indicated by arrows 432a'–432d') back into waveguide layer 406 so as to provide modulated, output light 418. In contrast, modified electron tunneling devices 416a"–416d", shown in FIG. 6D, are integrated into a modified optical waveguide layer 406". In this case, input light 414 directly couples into modified electron tunneling device 416a", which re-emits a modulated light 432a". Modulated light 432a" then couples into modified electron tunneling device 416b", and so on until the output from the last device in the series, in this case modified electron tunneling device 416d", becomes output light 418. Thus, each one of the configurations shown in FIGS. 6B–6D is advantageous in different situations, depending on the level of integration required. For example, although the electron tunneling devices are most readily fabricated on top of the rib waveguide region, it may be desirable in certain cases to have the direct coupling of the principal portion of the input light with the electron tunneling devices as allowed by the configuration shown in FIG. 6D. Alternatively, closer coupling of the evanescent field portions of input light 414 may be enabled by the positioning of the electron tunneling regions as shown in FIG. 6C without drastically altering the lightwave-guiding characteristics of the rib waveguide region.

Figure 6E:
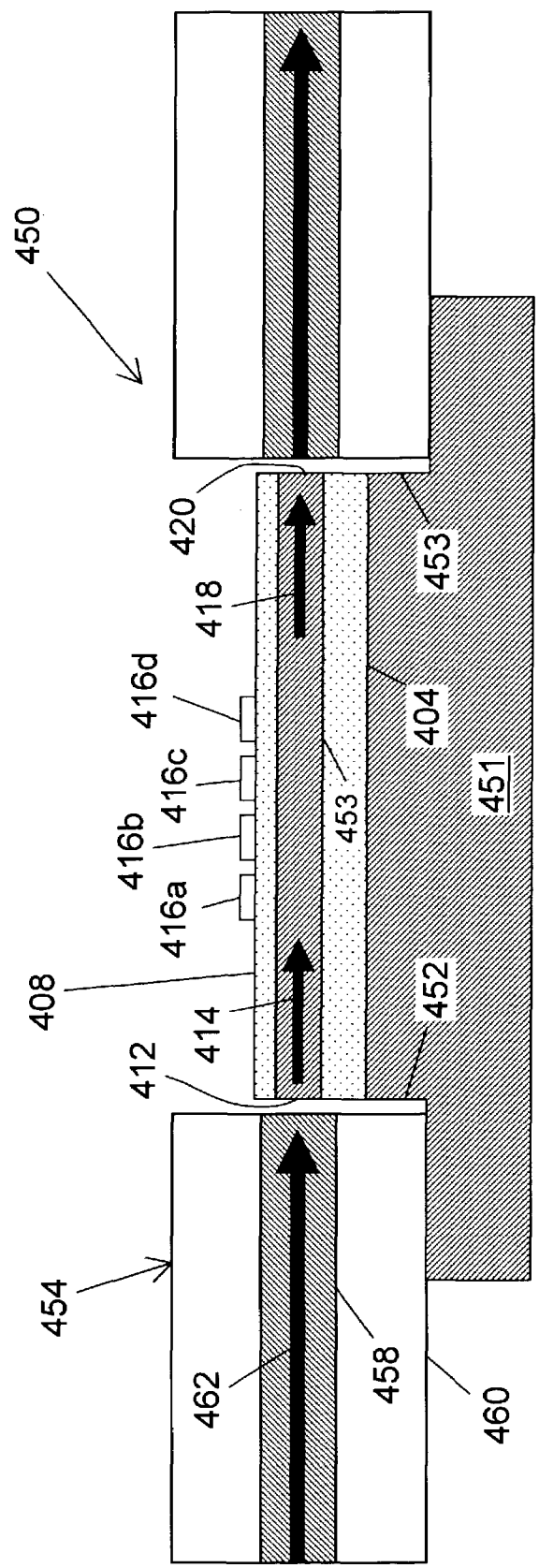

Attention is now directed to FIG. 6E, which illustrates an end-fire variation of the waveguide-coupled assembly of FIG. 6A, generally indicated by a reference number 450. To the extent that waveguide-coupled assembly 450 resembles previously described waveguide-coupled assembly 400, for example, with respect to its layered structure and the location of the electron tunneling devices, such descriptions are not repeated for purposes of brevity. A substrate 451 of waveguide-coupled assembly 450 includes first and second v-grooves 452 and 453, respectively, for accommodating an input optical fiber 454 and an output optical fiber 456, respectively. For example, input optical fiber 454 includes a fiber core 458 surrounded by a cladding 460, and is designed to direct an input optical signal 462 therethrough and into rib waveguide region 410 as input light 414. Output light 418 provided at optical output end 420 is then coupled into output optical fiber 456. As shown in FIG. 6E, output optical fiber 456 includes a fiber core 464 surrounded by a cladding 466 so as to direct at least a portion (indicated by an arrow 468) of output light 418 away from optical output end 420. The coupling of optical fiber to the rib waveguide region enables ready insertion of waveguide-coupled assembly 450 into optical fiber-based systems, such as long distance communication systems. This end-fire embodiment allows higher coupling efficiency for single-mode fibers. Furthermore, inclusion of alignment aids, such as v-grooves 452 and 453 in substrate 451 allows self-alignment of optical fiber with the waveguide-coupled assembly of the present invention.

Figure 7A:
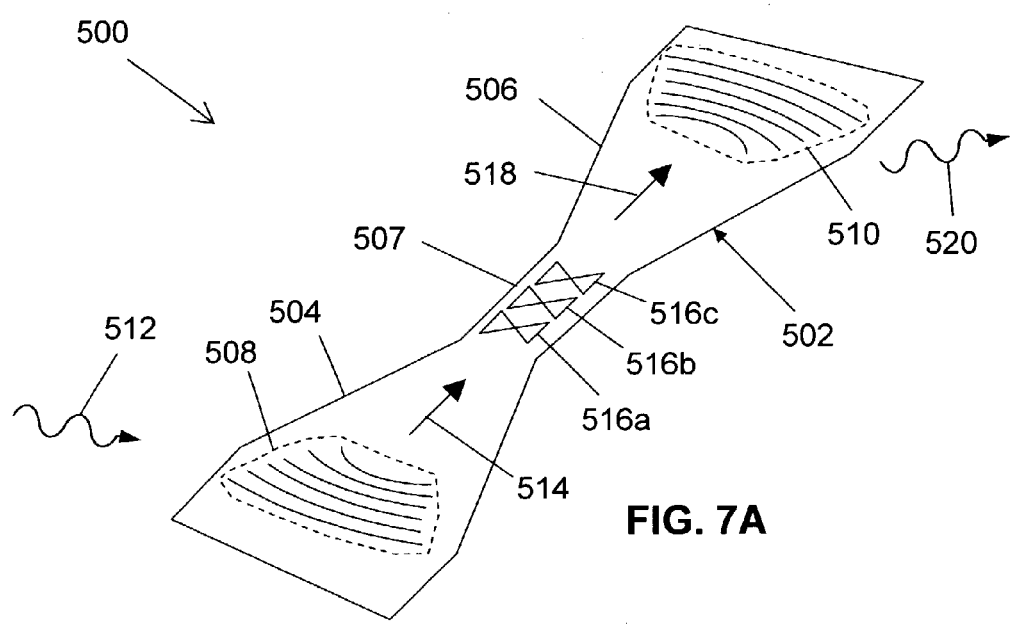
FIGS. 7A–7D are diagrammatic illustrations of an alternative waveguide-coupled device of the present invention and applications.

Referring now to FIGS. 7A–7D, still further variations of the waveguide-coupled assembly of the present invention are discussed. FIG. 7A shows a waveguide-coupled assembly 500, which includes a shaped waveguide 502. Shaped waveguide 502 includes first and second tapered sections 504 and 506, respectively, on either side of a middle section 507. First and second chirped, focusing grating couplers (surrounded by dashed lines 508 and 510, respectively) are formed near opposite ends of shaped waveguide 502 such that first chirped, focusing grating coupler 508 receives an input optical signal 512 and couples the optical signal so received into shaped waveguide 502 as an input light (indicated by an arrow 514). Input light 514 is then directed through first tapered section 504 into middle section 507. One or more electron tunneling devices (three are shown, indicated by reference numerals 516a–516c) are disposed on top of middle section 507 and are configured for, for example, modulating the input light then producing a modulated, output light (indicated by an arrow 518). Modulated, output light 518 is then directed through second tapered section 506 and coupled out of shaped waveguide 502 through second chirped, focusing grating coupler 510 as an output optical signal 520.

Figure 7B:
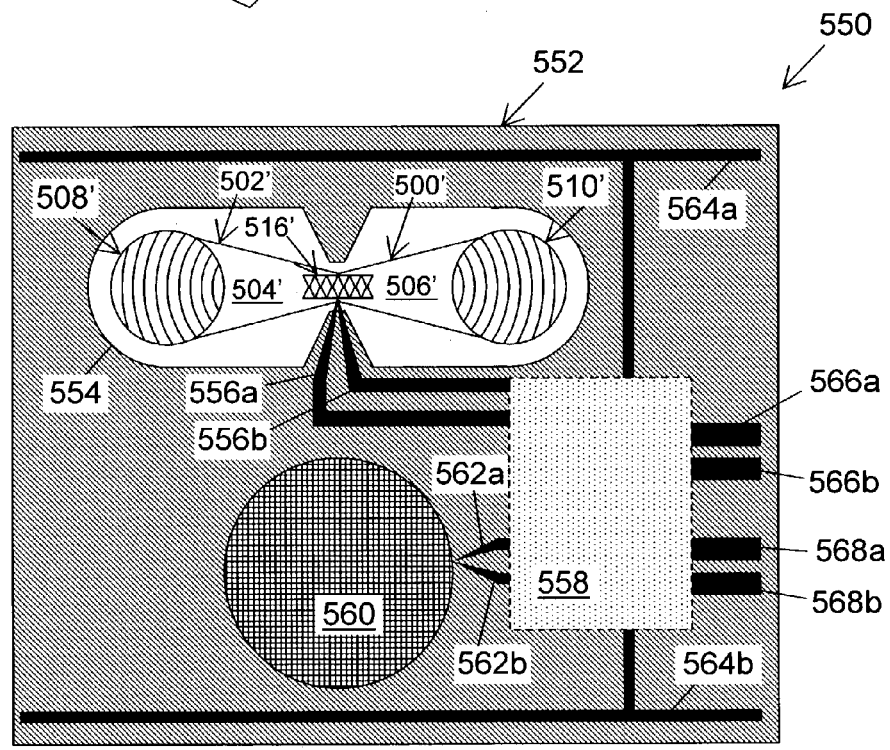

FIG. 7B is an illustration of an integrated optical transceiver chip including the waveguide-coupled assembly of FIG. 7A. The integrated optical transceiver chip, generally indicated by reference numeral 550, includes a substrate 552 on which various components are supported, as will be described in detail immediately hereinafter. Substrate 552 includes an etched-out section 554, in which a modified waveguide-coupled assembly 500', which is similar in design to waveguide-coupled assembly 500 as shown in FIG. 7A. To the extent that waveguide-coupled assembly 500' resembles previously described waveguide-coupled assembly 500, for example, with respect to its tapered waveguide structure, focused grating couplers and the location of the electron tunneling devices, such descriptions are not repeated for purposes of brevity. An array of electron tunneling devices 516' of waveguide-coupled assembly 500' are connected with modulation inputs 556a and 556b, which lead from circuitry 558 supported on substrate 552. Circuitry 558 is also connected with a detector 560, which is also supported on substrate 552, via leads 562a and 562b. Power may be supplied to circuitry 558 through DC power lines 564a and 564b.

Figure 7C:
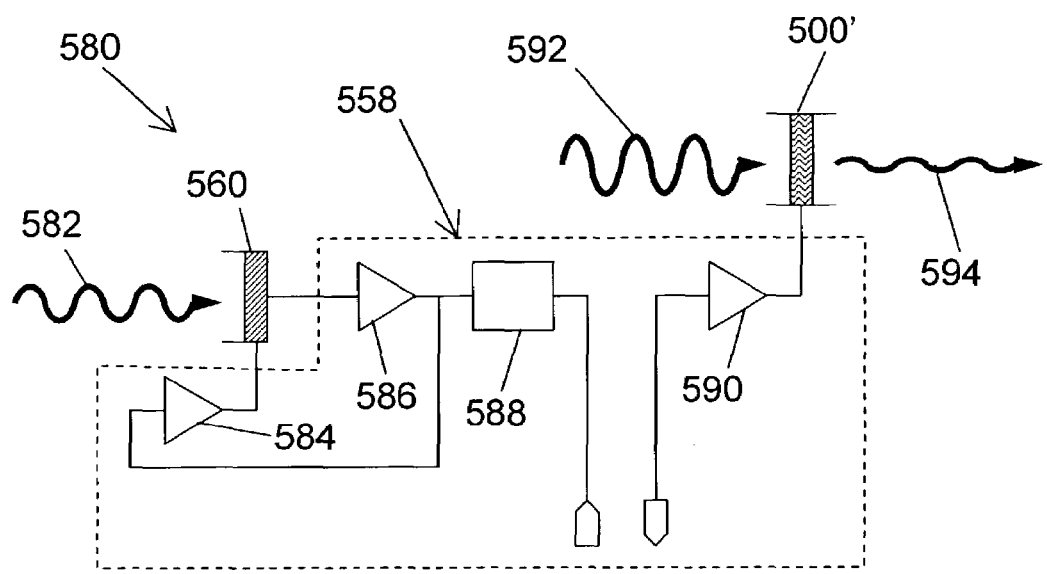

Referring now to FIG. 7B in conjunction with FIG. 7C, one example of the operation of integrated optical transceiver chip 550 is described in reference to a schematic 580 as shown in FIG. 7C. It is noted that corresponding components in the two figures are labeled with the same reference numbers for clarity. In one possible configuration, detector 560 may be designed to receive an optical signal 582, including data encoded thereon, and to provide an electrical, detector signal (not shown), also including the data, via leads 562a and 562b to circuitry 558. Circuitry 558 may include, for example, electrical components such as bias control/automatic gain control (AGC) 584, a pre-amplifier 586, a clock recovery circuit 588 as well as a modulator driver 590. Modulator driver 590 generates a modulation signal in accordance with the detector signal and directs the modulation to the array of electron tunneling devices of waveguide-coupled assembly 500'. As a result, when a continuous wave (CW) light input 592 is incident on first chirped, focusing grating coupler 508', the array of electron tunneling devices modulate the CW light input and, consequently, waveguide-coupled assembly 500' provides a modulated light output 594.

Figure 7D:
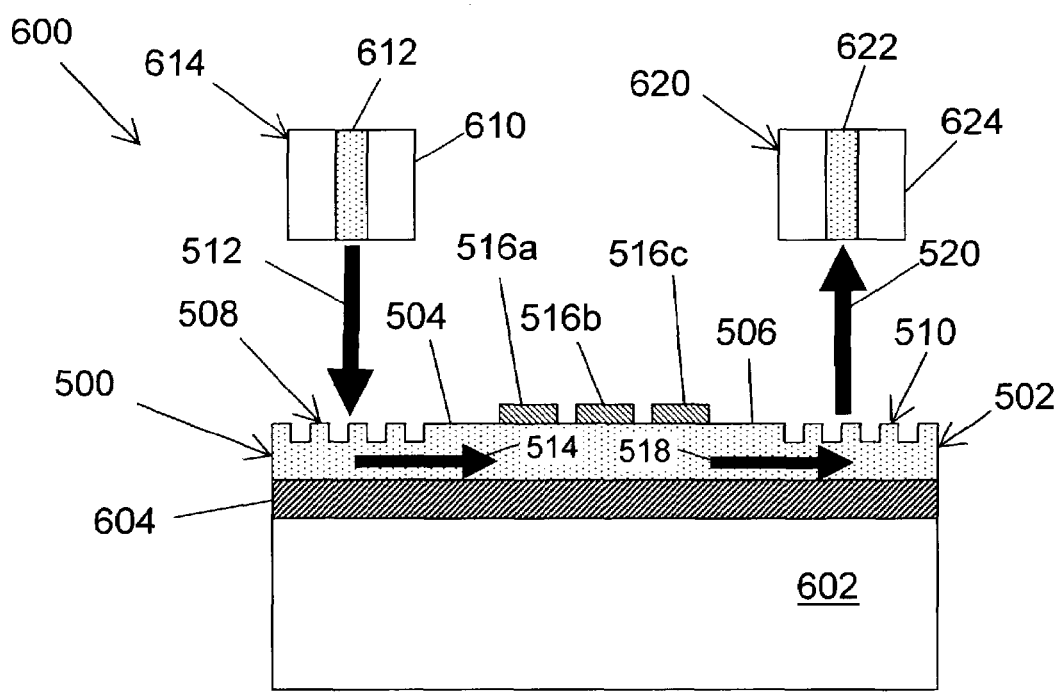

FIG. 7D illustrates a further variation on the waveguide-coupled assembly of the present invention as illustrated in FIG. 7A. FIG. 7D is a diagrammatic view, in cross section, of a modified waveguide-coupled assembly 600. Modified waveguide-coupled assembly 600 includes waveguide-coupled assembly 500, as shown in FIG. 7A, supported on a substrate 602 with an insulating layer 604 disposed therebetween. Input light 512 is provided through an input optical fiber 610, which includes a fiber core 612 surrounded by a cladding 614. As described previously in reference to FIG. 7A, waveguide-coupled assembly 500 provides a modulated, output light 520. In the case of modified waveguide-coupled assembly 600, output light 520 is received by an output optical fiber 620, which also includes a fiber core 622 surrounded by a cladding 624 for guiding the output light away from the modified waveguide-coupled assembly.

Figure 8A:
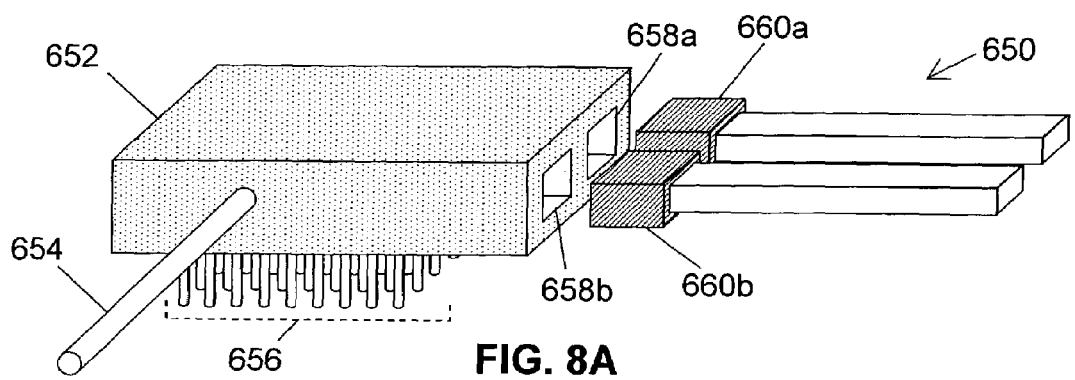
FIGS. 8A–8C are diagrammatic illustrations, in perspective view, of examples of packaging options and applications for the waveguide-coupled device of the present invention.
Figure 8B:
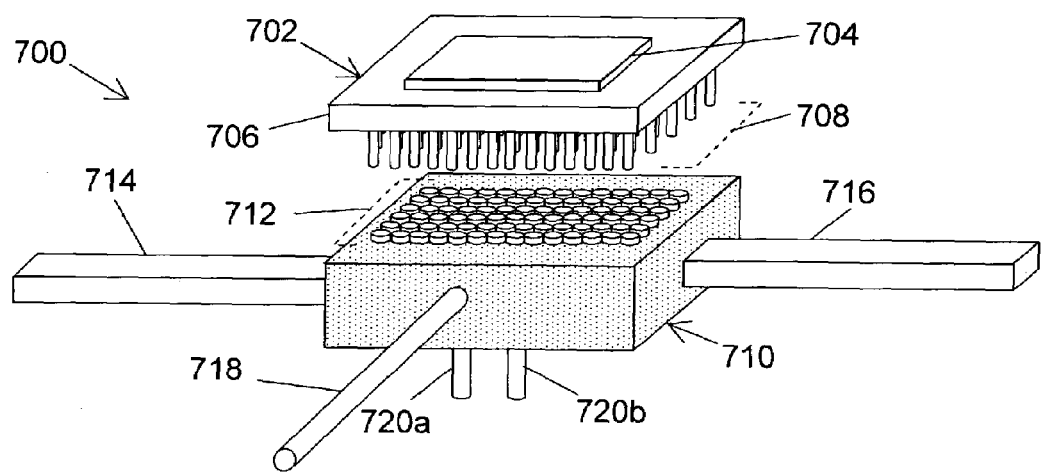
Figure 8C:
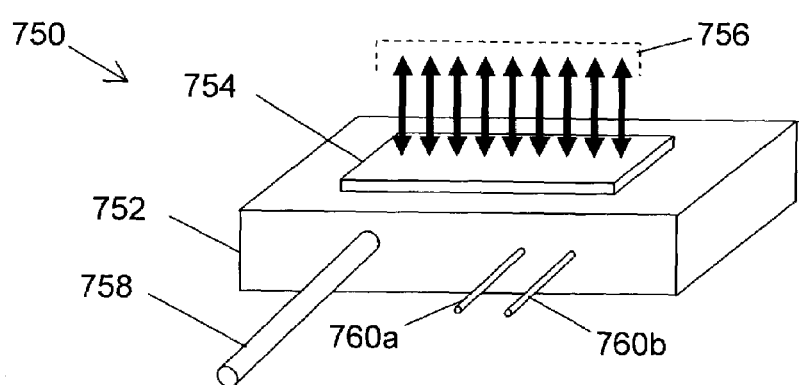

Turning now to FIGS. 8A–8C, several packaging options for integrated optical transceiver chip 550 as shown in FIG. 7B are described. FIG. 8A shows a parallel optical transceiver 650 including a transceiver module 652 containing a plurality of integrated optical transceiver chips 550 therein (not visible). A single mode fiber 654 serves as a CW input for modulation. A plurality of pin-outs (indicated by dashed bracket 656) serves to provide the various RF inputs/outputs as well as DC power input. Transceiver module 652 includes an input receptacle 658a and an output receptacle 658b, both of which are designed to accept multi-mode fiber (MMF) ribbons. For example, a first MMF ribbon 660a may provide a plurality of optical data inputs for the plurality of integrated optical transceiver chips, while a second MMF ribbon 660b may serve to extract the plurality of optical data outputs produced by the integrated optical transceiver chips.

FIG. 8B illustrates a scheme in which two or more chips may be optically interconnected. A chip-to-chip optical backplane 700 is designed to accept a lead frame-mounted chip 702. Lead frame-mounted chip 702 includes a die 704 containing circuitry and connected to a lead frame 706 including a plurality of pin-outs (indicated by a dashed bracket 708). Optical backplane 700 includes an integrated circuit socket 710 including a plurality of receptacles (indicated by a dashed bracket 712) corresponding to the pin-outs of the lead frame-mounted chip. Optical backplane 700 further includes a MMF ribbon input 714, a MMF ribbon output 716, CW input 718 and DC power input through leads 720a and 720b. Integrated circuit socket 710 includes a plurality of the aforedescribed optical transceiver chips so as to directly connect a chip in a standard lead frame package with the optical transceivers.

FIG. 8C illustrates yet another packaging option for the optical transceiver chip of the present invention. An optical processor chip 750 includes a package 752 containing a plurality of optical transceiver chips (not visible). Package 752 includes an optical window 754, which allows direct, optical connection of the optical processor chip with other optical components through a parallel optical bus (indicated by arrows bracketed by a dashed bracket 756). Package 752 also includes the usual inputs for CW optical input (an optical fiber 758) and DC power input (leads 760a and 760b).

Although each of the aforedescribed embodiments have been illustrated with various components having particular respective orientations, it should be understood that the present invention may take on a variety of specific configurations with the various components being located in a wide variety of positions and mutual orientations and still remain within the spirit and scope of the present invention. Furthermore, suitable equivalents may be used in place of or in addition to the various components, the function and use of such substitute or additional components being held to be familiar to those skilled in the art and are therefore regarded as falling within the scope of the present invention. For example, a reflective layer may be disposed between the circuitry layer and the waveguide layer for better isolation of the waveguide layer from the circuitry as well as for improved coupling of optical signals from the waveguide into the electron tunneling devices (see, for example, the '935 application). Also, the waveguide layer shown, for example, in FIG. 1A may be a separately deposited waveguide or a silicon-on-insulator (SOI) integrated waveguide. Furthermore, the substrate itself may be optically transmissive or guiding such that the optical signal may be provided from the substrate side of the interconnect arrangement rather than being edge-fed or incident from the top side. Still further, a variety of light coupling arrangements may be included in the embodiments of the present invention such as, and not limited to, antennas (as shown in, for instance, FIGS. 1A and 6A), grating couplers and surface plasmon evanescent couplers, all of which are discussed in detail in the aforementioned '988, '972, '054, '535 and '935 applications.

Therefore, the present examples are to be considered as illustrative and not restrictive, and the invention is not to be limited to the details given herein but may be modified within the scope of the appended claims.

REFERENCES

1. Neil Savage, "Linking with Light," *IEEE Spectrum*, vol. 39, Issue 8, pp. 32–36 (2002).

2. A. F. J. Levi, "Optical Interconnects in Systems," *Proceedings of the IEEE*, vol. 88, pp. 750–757 (2002).
3. Brian J. Soller and Dennis G. Hall, "Energy transfer at optical frequencies to silicon-based waveguiding structures," J. Opt. Soc. Am. A, vol. 18, no. 10, pp. 2577–2584 (2001).

What is claimed is:

1. An electro-optical device, comprising:
   a formation of integrated layers, said integrated layers being configured so as to define at least one integrated electronic component; and
   an electron tunneling device, said electron tunneling device including
      first and second non-insulating layers spaced apart from one another such that a given voltage can be provided across the first and second non-insulating layers, and
      an arrangement disposed between the first and second non-insulating layers and configured including at least one layer for supporting electron tunneling between and to said first and second non-insulating layers, and
      an antenna structure that is formed, at least in part, from said first and second non-insulating layers as part of said tunneling device, and wherein said electron tunneling device is electrically connected with said integrated electronic component.

2. The electro-optical device of claim 1 wherein said electron tunneling device is configured such that using only said first layer in the arrangement would result in a given value of nonlinearity in said electron tunneling, with respect to said given voltage, and wherein said arrangement further includes a different, second layer disposed directly adjacent to and configured to cooperate with said first layer such that said nonlinearity, with respect to said given voltage, is increased ever and above said given value of nonlinearity by the inclusion of said second layer.

3. The electro-optical device of claim 2 wherein said first layer is formed of a first insulating material.

4. The electro-optical device of claim 3 wherein said first layer in said arrangement is formed of an amorphous, insulating material.

5. The electro-optical device of claim 3 wherein said second layer is formed of a different, second insulating material.

6. The electro-optical device of claim 1 wherein said integrated electron tunneling device is configured to form a rectifying element.

7. The electro-optical device of claim 1 wherein said integrated electron tunneling device is configured to form a Schottky diode.

8. The electro-optical device of claim 1 wherein said antenna structure is integrally formed from said first and second non-insulating layers.

9. The electro-optic device of claim 1 wherein said electron tunneling device is supported on a surface that is defined by said formation of integrated layers while being electrically connected with said integrated electronic component.

10. The electro-optical device of claim 1 wherein said electron tunneling device is integrally formed with said formation of integrated layers.

* * * * *